(12) United States Patent
Tokiwa

(10) Patent No.: US 9,564,228 B2
(45) Date of Patent: Feb. 7, 2017

(54) SEMICONDUCTOR MEMORY DEVICE AND MEMORY SYSTEM

(71) Applicant: KABUSHIKI KAISHA TOSHIBA, Tokyo (JP)

(72) Inventor: Naoya Tokiwa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/094,631

(22) Filed: Apr. 8, 2016

(65) Prior Publication Data

US 2016/0365150 A1  Dec. 15, 2016

(30) Foreign Application Priority Data

Jun. 12, 2015  (JP) ................................. 2015-119551

(51) Int. Cl.
*G11C 11/00* (2006.01)
*G11C 16/10* (2006.01)
*G11C 16/26* (2006.01)

(52) U.S. Cl.
CPC ............... *G11C 16/10* (2013.01); *G11C 16/26* (2013.01)

(58) Field of Classification Search
CPC .......... G11C 16/10; G11C 16/30; G11C 16/12
USPC ............. 365/185.18, 189.05, 189.16, 189.12
See application file for complete search history.

(56) References Cited

U.S. PATENT DOCUMENTS

| 7,505,312 B2 | 3/2009 | Matsunaga et al. |
| 7,505,335 B2 | 3/2009 | Shibata |
| 8,363,486 B2 | 1/2013 | Abiko |
| 2007/0177429 A1* | 8/2007 | Nagashima ............ G11C 16/12 365/185.22 |
| 2009/0267128 A1 | 10/2009 | Maejima |
| 2009/0268522 A1 | 10/2009 | Maejima |
| 2010/0207195 A1 | 8/2010 | Fukuzumi et al. |
| 2011/0284946 A1 | 11/2011 | Kiyotoshi |
| 2012/0134212 A1* | 5/2012 | Higashi ............... G11C 11/5628 365/185.17 |

* cited by examiner

*Primary Examiner* — Son Dinh
(74) *Attorney, Agent, or Firm* — Patterson & Sheridan, LLP

(57) ABSTRACT

A semiconductor memory device includes a memory cell, and a control circuit configured to execute a writing operation on the memory cell in response to a write command. The writing operation includes a first operation in which a first initial program voltage is applied and a second operation in which a second initial program voltage higher than the first initial program voltage is applied. The control circuit, in response to a status inquiry command, outputs a first signal when the status inquiry command is received during execution of the first operation, and outputs a second signal which is different from the first signal when the status inquiry command is received during execution of the second operation.

20 Claims, 23 Drawing Sheets

SEMICONDUCTOR MEMORY DEVICE AND MEMORY SYSTEM

CROSS-REFERENCE TO RELATED APPLICATION

This application is based upon and claims the benefit of priority from Japanese Patent Application No. 2015-119551, filed Jun. 12, 2015, the entire contents of which are incorporated herein by reference.

FIELD

Embodiments described herein relate generally to a semiconductor memory device and a memory system.

BACKGROUND

A NAND flash memory in which memory cells are three dimensionally arranged is known.

DETAILED DESCRIPTION

Figure 1:
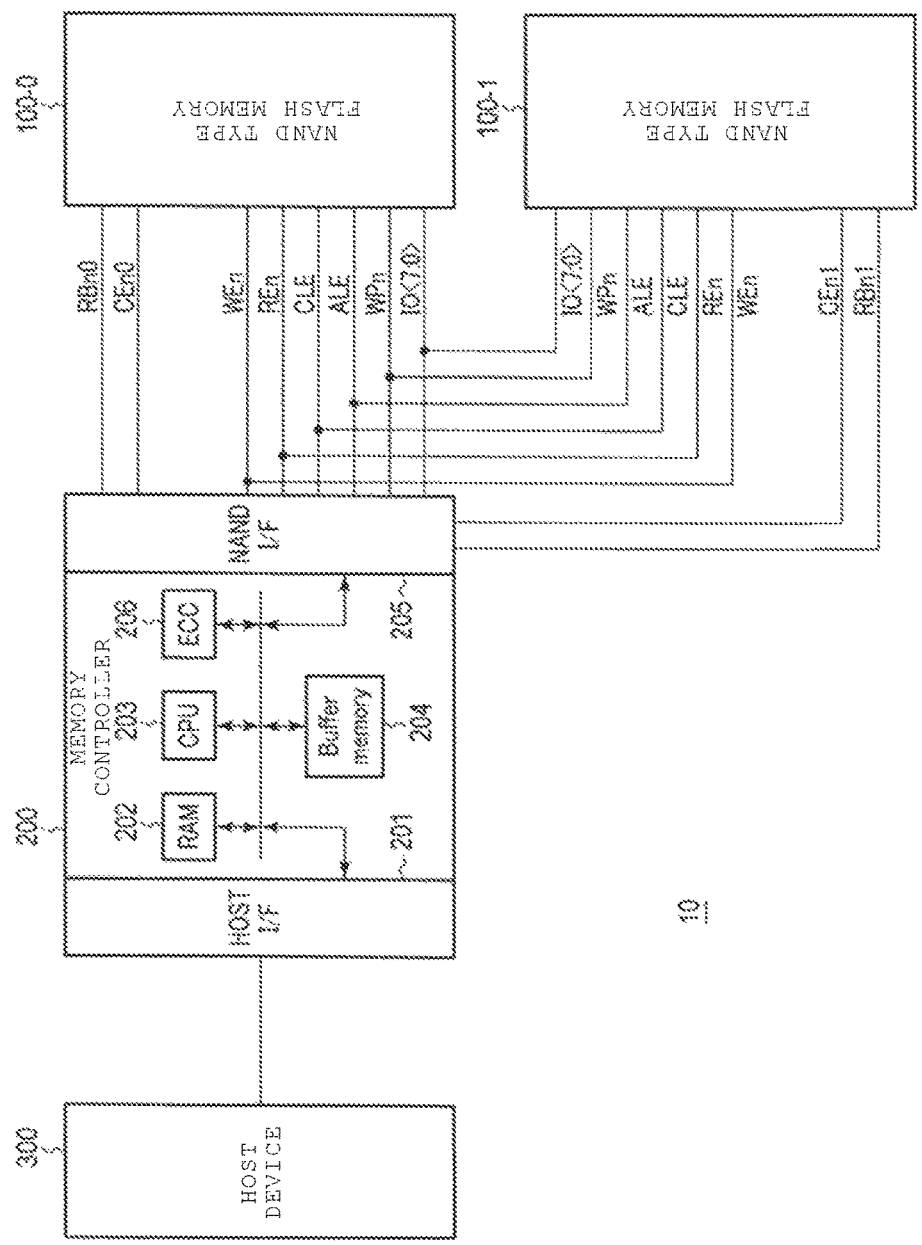
FIG. 1 is a block diagram of a memory system according to a first embodiment.

Embodiments now will be described more fully hereinafter with reference to the accompanying drawings. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, such elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, when the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, when the structure in one of the figures is turned over, elements described as "below" or "beneath" other elements would then be oriented "above" the other elements. The exemplary terms "below" or "beneath" can, therefore, encompass both an orientation of above and below.

Embodiments are described herein with reference to cross section and perspective illustrations that are schematic illustrations of the embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Embodiments provide a semiconductor memory device and a memory system which are capable of improving the entire system.

In general, according to the exemplary embodiment, a semiconductor memory device includes a memory cell, and a control circuit configured to execute a writing operation on the memory cell in response to a write command. The writing operation includes a first operation in which a first initial program voltage is applied and a second operation in which a second initial program voltage higher than the first initial program voltage is applied. The control circuit, in response to a status inquiry command, outputs a first signal when the status inquiry command is received during execution of the first operation, and outputs a second signal which is different from the first signal when the status inquiry command is received during execution of the second operation.

The semiconductor memory device in the exemplary embodiment will be described below with reference to the drawings. Note that, the same components are denoted by the same reference numerals in the drawings.

First Embodiment

As the semiconductor memory device, an example of a three-dimensional stacked NAND type flash memory will be described.

1. Configuration of Semiconductor Memory Device

Memory System

A configuration example of a memory system 10 including a NAND type flash memory 100 according to a first embodiment will be described with reference to FIG. 1.

As illustrated in FIG. 1, the memory system 10 is provided with, for example, a plurality of NAND type flash memories 100, one memory controller 200, and one host device 300. The drawings and the following description are based on an example in which two NAND type flash memories (100-0 and 100-1) are provided. In other examples, one or three or more of memories 100 may be connected to the memory controller 200.

Each of the NAND type flash memories 100 are provided with a plurality of memory cells, and may store data in a non-volatile manner. A configuration of the NAND type flash memory 100 will be described below in detail.

The memory controller 200 commands the NAND type flash memory 100 to perform the reading, the writing (hereinafter, referred to as programming in some cases), and the erasing of data based on a command from the host device 300.

The memory controller 200 is provided with a host interface circuit 201, a memory (RAM) 202, a processor (CPU) 203, a buffer memory 204, a NAND interface circuit 205, and an error correction code (ECC) circuit 206.

The host interface circuit 201 is connected to the host device 300 via a controller bus, and controls communication between the memory controller 200 and the host device 300.

The NAND interface circuit 205 is connected to each of the NAND type flash memories 100 via a NAND bus, and controls communication between the memory controller 200 and the NAND type flash memory 100. The same signals are transmitted and received on the NAND bus which is connected to each of the NAND type flash memories 100. Each NAND bus transmits input and output signals, various control signals, and a status code signal. The control signal includes chip enable signals CEn0 and CEn1, a write enable signal WEn, a read enable signal REn, a command latch enable signal CLE, an address latch enable signal ALE, a write protect signal WPn, and the like. The signals WEn, REn, CLE, ALE, and WPn are received by the NAND type flash memories 100-0 and 100-1. The signal CEn0 is received by the NAND type flash memory 100-0, and the signal CEn1 is received by the NAND type flash memory 100-1.

Input and output signals IO (IO<7:0>) transmits, for example, 8-bit data. The signal IO includes, for example, a command, address data, and data or the like. When the signals CEn (CEn0 and CEn1) are asserted, the NAND type flash memory 100 which receives the signals is set to be in an enable state. When the write enable signal WEn is asserted, the NAND type flash memory 100 which receives the signal is instructed to capture the signal IO. When the signal REn is asserted, the NAND type flash memory 100 which receives the signal is instructed to output the signal IO. The signal CLE instructs the NAND type flash memory 100 which receives the signal to capture the signal IO as a command. The signal ALE instructs the NAND type flash memory 100 which receives the signal to capture the signal IO as address data. When the signal WPn is asserted, the NAND type flash memory 100 which receives the signal is instructed to not capture the signal IO.

The status code signal indicates various states of the NAND type flash memory 100. The status code signal includes, for example, ready/busy signals RBn (RBn0 and RBn1), and a status code signal CODE_PW1COMP. The signal RBn0 is output from the NAND type flash memory 100-0, and the signal RBn1 is output from the NAND type flash memory 100-1. The memory controller 200 may detect the state of each of the NAND type flash memories 100 by receiving the status code signal.

The CPU 203 controls an operation of the entire memory controller 200.

The memory 202 is, for example, a dynamic random access memory (DRAM), and is used as a working region of the CPU 230.

The buffer memory 204 temporarily holds data which is transmitted to the memory 100, and data which is transmitted from the memory 100.

The ECC circuit 206 detects and corrects data error by using an error-correcting code.

Configuration of NAND Type Flash Memory

Figure 2:
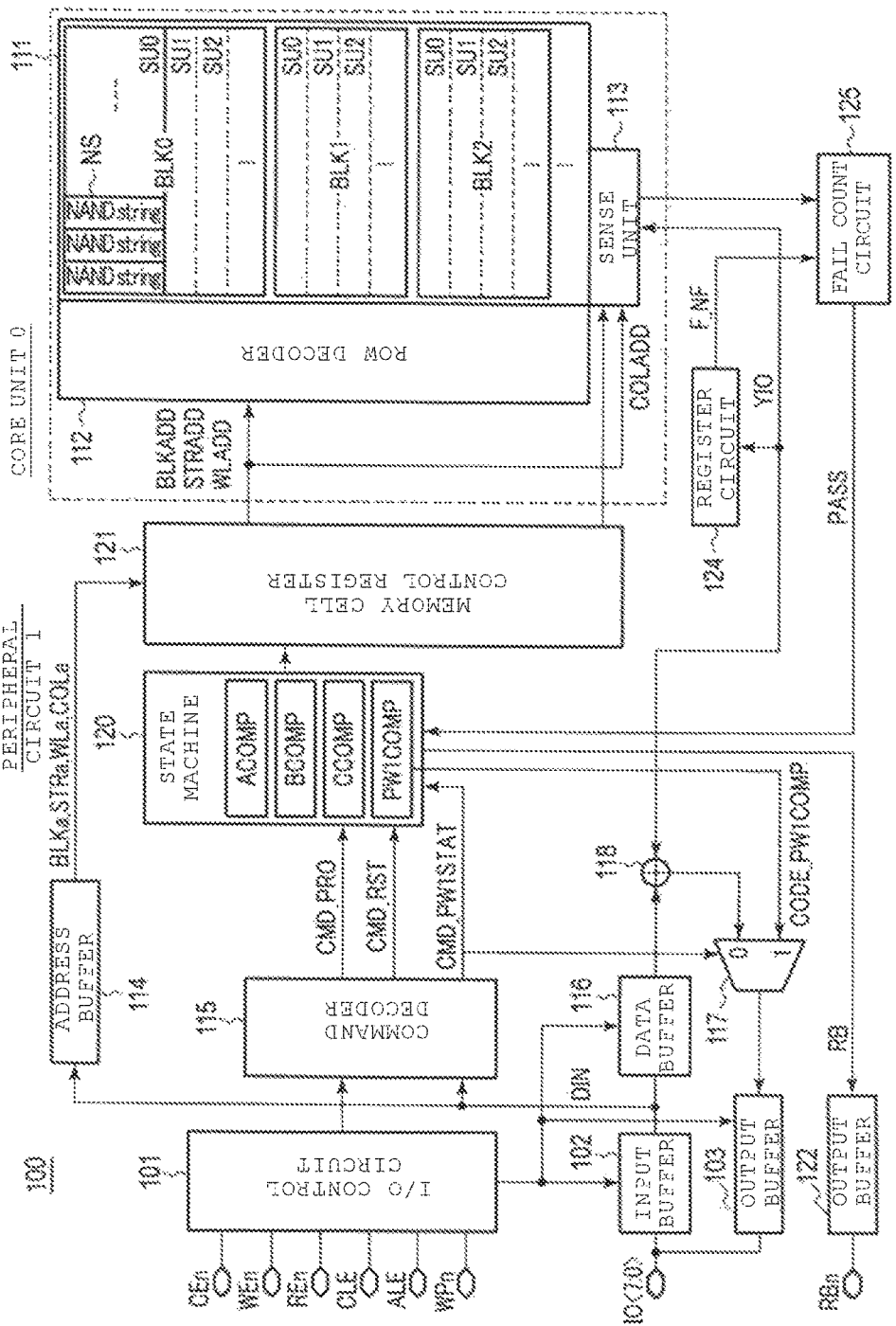
FIG. 2 is a block diagram of a semiconductor memory device according to the first embodiment.

Next, the configuration of the memory 100 will be described with reference to FIG. 2. As illustrated in FIG. 2, the memory 100 includes a core unit 0 and a peripheral circuit 1.

The core unit 0 includes a memory cell array 111, a row decoder 112, and a sense unit 113. The core unit 0 may include a plurality of memory cell arrays 111.

The memory cell array 111 is provided with a plurality of blocks BLK (BLK0, BLK1, BLK2, and the like). Each block BLK is provided with a plurality of string units (also referred to as "fingers") SU (SU0, SU1, SU2, and the like). Each string unit SU is provided with a plurality of NAND string NS. Each string NS is provided with a plurality of memory cells which are connected to each other in series.

The peripheral circuit 1 includes an input and output (I/O) control circuit 101, an input buffer 102, output buffers 103 and 122, an address buffer 114, a command decoder 115, a data buffer 116, selection circuits 117 and 118, a state machine 120, a memory cell control register 121, a register circuit 124, and a fail count circuit 125.

The I/O control circuit 101 is connected to an input pin (terminal) which receives the signals CEn, WEn, REn, CLE, ALE, and WPn. The I/O control circuit 101 controls the input buffer 102, the output buffer 103, and the data buffer 116 based on the signals CEn, WEn, REn, CLE, ALE, and WPn.

The input buffer 102 and the output buffer 103 are connected to an input and output pin (terminal) by which the signal IO is input and output. The input buffer 102 extracts the address data from the signal IO based on the control of the I/O control circuit 101, and supplies the extracted address data to the address buffer 114 as a data signal DIN. In addition, the input buffer 102 extracts the command from the signal IO based on the control of the I/O control circuit 101, and supplies the extracted command to the command decoder 115 as a data signal DIN. Further, the input buffer 102 extracts data from the signal IO based on the control of the I/O control circuit 101, and supplies the extracted data to the data buffer 116 as a data signal DIN. The output buffer 103 outputs read data or the like which is supplied from the selection circuit 117 via the input and output pin as the signal 10.

The address buffer 114 holds an address data and supplies the address data to the memory cell control register 121. The address data includes address data items BLKa, STRa, WLa, and COLa. The address data items BLKa, STRa, WLa, and COLa are distinguished in accordance with the order and position of bit string of the data signal DIN. The address data BLKa specifies the block. The address data STRa specifies string (a string unit). The address data WLa specifies a word line. The address data COLa specifies a column.

The data buffer 116 receives data from the input buffer 102 based on the control of the I/O control circuit 101, and temporarily holds the received data. The data from the input buffer 102 includes write data or the like. The data buffer 116 transmits the write data or the like to the sense unit 113 via the selection circuit 118.

The selection circuit 118 transmits data from the data buffer 116 to the sense unit 113, and transmits data from the sense unit 113 to the output buffer 103.

The command decoder 115 receives a command based on the control of the I/O control circuit 101. The command decoder 115 decodes the command and supplies various command signals to the state machine 120 based on the result of the decoding. The command signal includes, for example, signals CMD_PRO, CMD_RST, and CMD_PW1STAT. The signal CMD_PRO instructs the state machine 120 to perform the writing. The signal CMD_RST instructs the NAND type flash memory 100 to suspend the operations of the writing and the like. A signal CMD_PW1STAT controls the selection circuit 117. The command decoder 115 transmits the signal CMD_PW1STAT of an "H" level to the selection circuit 117 and the state machine 120 when the memory 100 receives an inquiry command.

The state machine 120 controls the operations of the reading, the writing, the erasing, and the like in the memory 100. The state machine 120 controls the memory cell control register 121 based on the command signal from the command decoder 115.

The state machine 120 includes registers PW1COMP, ACOMP, BCOMP, and CCOMP. The registers PW1COMP, ACOMP, BCOMP, and CCOMP hold information indicating a state of a writing operation by the state machine 120 (a progress situation or the like). The registers PW1COMP, ACOMP, BCOMP, and CCOMP hold information indicating, for example, the completion of a corresponding step among a plurality of steps of the writing operation when the corresponding step is completed. When receiving the signal CMD_PW1STAT, the state machine 120 transmits information in the register PW1COMP to the selection circuit 117 as a status code CODE_PW1COMP.

The selection circuit 117 receives the data from the selection circuit 118 and the status code CODE_PW1COMP from the register PW1COMP. The selection circuit 117 transmits the data from the selection circuit 118, or the status code CODE_PW1COMP to the output buffer 103 based on the signal CMD_PW1STAT.

The memory cell control register 121 stores information for controlling the operation of the reading, the writing, and the erasing of the memory cell, and transmits the signal to the core unit 0 based on the stored information. The signal which is transmitted from the memory cell control register 121 includes, for example, a block address BLKADD, a string address STRADD, a word line address WLADD, a column COLADD, and a command signal from the state machine 120. The memory control register 121 transmits the block address BLKADD, the string address STRADD, and the word line address WLADD to the row decoder 112 and transmits the column address COLADD to the sense unit 113.

The row decoder 112 selects one block BLK based on the block address BLKADD, selects one string NS based on the string address STRADD, and selects one word line based on the word line address WLADD. That is, the row decoder 112 receives various voltages in accordance with an operation from a voltage generation circuit (not shown), and in the selected string STR of the selected block BLK, the row decoder 112 transmits the voltage from the voltage generation circuit to the selected word line and the non-selected word lines other than the selected word line.

The sense unit 113 outputs selected column data as a signal YIO based on the column address COLADD. The sense unit 113 receives the write data from the data buffer 116 as the signal YIO and transmits the write data to the memory cell, during writing of data.

The output buffer 122 is connected to an output pin which outputs the ready/busy signal RBn. The output buffer 122 receives, for example, the ready/busy signal RB from the state machine 120. The ready/busy signal RB indicates whether the NAND type flash memory 100 is in a ready state or a busy state. The output buffer 122 outputs the received ready/busy signal RB via the output pin as the ready/busy signal RBn.

The register circuit 124 holds fuse data. The fuse data is read from a fuse area (not shown) in the memory cell array 111, and for example, fuse data is read when the memory 100 receives electric power during power-up. The fuse data includes a fail reference value F_NF or the like. The fail reference value F_NF or the like is used as a reference value during confirming whether or not the writing or erasing is completed.

The fail count circuit 125 receives the fail reference value F_NF from the register circuit 124. The fail count circuit 125 compares data which is read from the sense unit 113 with an expected value during "verify", and counts the number of mismatched bits or bytes. The "verify" refers to determining whether or not the erasing or the writing is completed. The expected value is a value which is written during the writing, and is a value to be included in the memory cell in the erased state during the erasing. The fail count circuit 125 compares a count result with the fail reference value F_NF. As a result of the comparison, when the number of mismatched bits or bytes is equal to or less than the fail reference value F_NF, the fail count circuit 125 determines that the writing or the erasing is completed and when the number of mismatched bits or bytes is greater than the fail reference value F_NF, the fail count circuit 125 determines that the writing or the erasing is not completed yet. When the writing or the erasing is completed, the fail count circuit 125 transmits, for example, a signal PASS of "H" level to the state machine 120. The state machine 120 changes the value of the registers PW1COMP, ACOMP, BCOMP, and CCOMP based on the signal PASS.

Memory Cell Array

Figure 3:
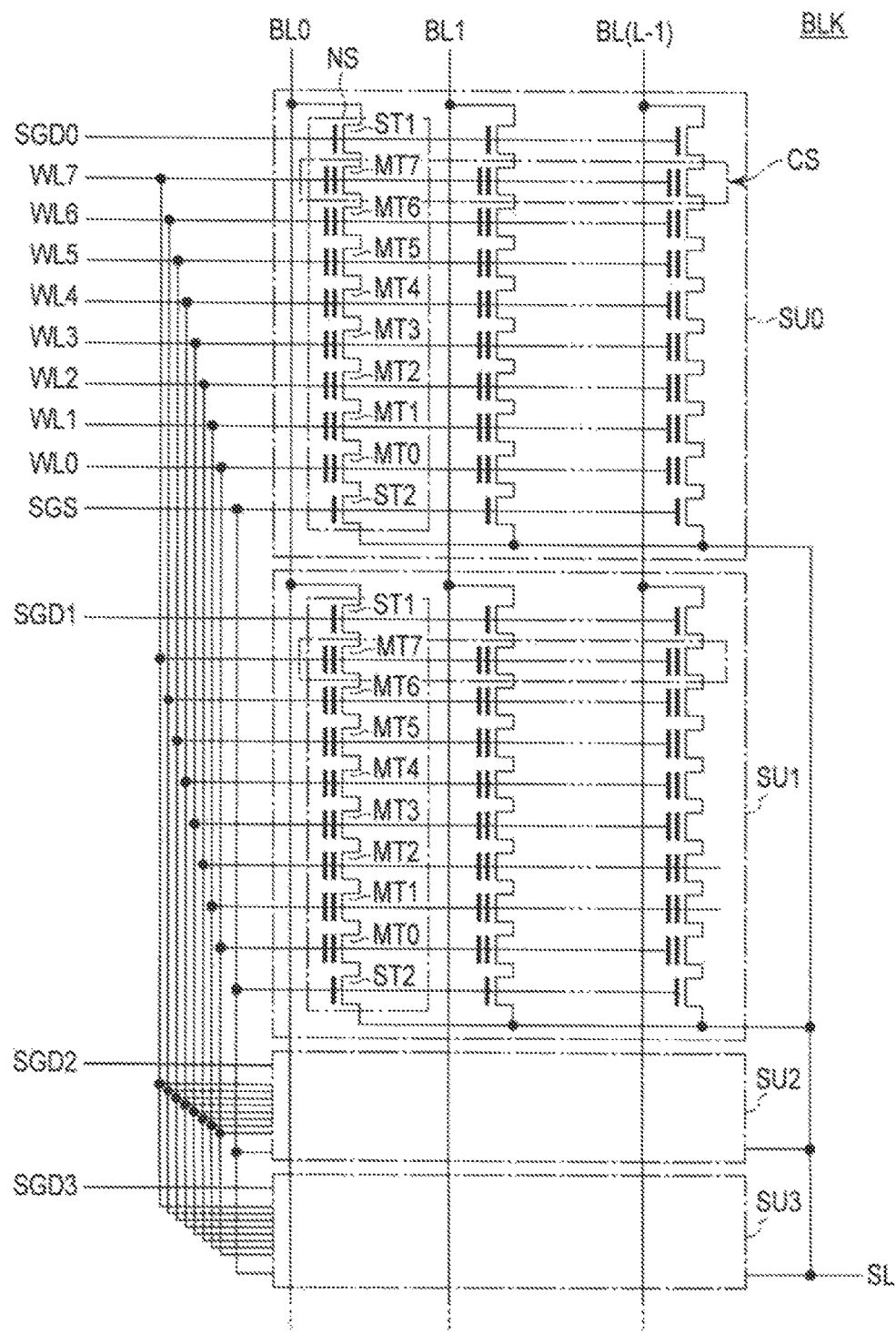
FIG. 3 is a circuit diagram of a memory cell array of the semiconductor memory device according to the first embodiment.

Next, a configuration of a memory cell array 111 will be described with reference to FIG. 3. FIG. 3 illustrates a portion of the memory cell array 111, and is a circuit diagram of one block. As illustrated in FIG. 3, each string NS includes a plurality of memory cell transistors MT (MT0 to MT7), and select gate transistors ST1 and ST2.

The transistor MT is provided with a stacked gate. The stacked gate includes a control gate and a charge storage layer. The transistor MT serves as the memory cell, and may hold data in a non-volatile manner.

The transistors MT on each string NS are connected to each other in series between the transistors ST1 and ST2. An end of the transistor MT7 is connected to an end of the transistor ST1. An end of the transistor MT0 is connected to an end of the transistor ST2. In the string units SU, the other ends of the transistors ST1 of the plurality of strings NS are connected to different bit lines BL (BL0 to BL (L−1)). L is a natural number of 2 or more. The other ends of the transistors ST2 are connected to a source line SL in common.

A gate of the transistor ST1 in a string unit SUn is connected to a select gate line SGDn, where n is 0 or a natural number of 1 or more. Gates of the transistors ST2 in the string units SU are connected to a select gate line SGS in common. Further, the select gate line SGS is shared between the different string units SU. The control gate of each of transistors MTm in the same block BLK is connected to the word lines WLm, where m is 0 or a natural number of 7 or less.

The data of the transistor MT in the same block BLK is, for example, collectively erased. Here, a method of erasing data is not limited to the above method, for example, a method of erasing data in a smaller unit than the block BLK may be employed. The erasing of data is disclosed in "NONVOLATILE SEMICONDUCTOR MEMORY DEVICE" of U.S. Pat. No. 8,514,627 (U.S. patent application Ser. No. 13/235,389), and "NON-VOLATILE SEMICONDUCTOR STORAGE DEVICE" of U.S. Pat. No. 8,233,323 (U.S. patent application Ser. No. 12/694,690). The entire contents of these Patent Applications are incorporated herein by reference.

The reading and writing of data is collectively performed with respect to a plurality of transistors MT (CS) which are connected to any word line WL in common in any one of the string units SU. A storing space of the transistors MT includes one or more of pages. Each of the transistors MT may hold 2-bit or more data, and for example, when each of the transistors MT holds 2-bit data, among 2-bit data which is held by each transistor MT, a group of lower bit is referred to as a "lower page" and a group of upper bit is referred to as an "upper page".

A configuration of the memory cell array is disclosed in, for example, "THREE DIMENSIONAL STACKED NON-VOLATILE SEMICONDUCTOR MEMORY" of U.S. Patent Application Pub. No. 2009/0267128 (U.S. patent application Ser. No. 12/407,403). In addition, a configuration of the memory cell array is disclosed in "THREE DIMENSIONAL STACKED NONVOLATILE SEMICONDUCTOR MEMORY" of U.S. Patent Application Pub. No. 2009/0268522 (U.S. patent application Ser. No. 12/406,524), "NON-VOLATILE SEMICONDUCTOR STORAGE DEVICE AND MANUFACTURING METHOD OF MANUFACTURING THE SAME" of U.S. Patent Application Pub. No. 2010/0,207,195 (U.S. patent application Ser. No. 12/679,991), and "SEMICONDUCTOR MEMORY AND METHOD FOR MANUFACTURING SAME" of U.S. Patent Application Pub. No. 2011/0,284,946 (U.S. patent application Ser. No. 12/532,030). The entire contents of these Patent Applications are incorporated herein by reference.

Sense Unit

The sense unit 113 will be further described with reference to FIG. 4.

Figure 4:
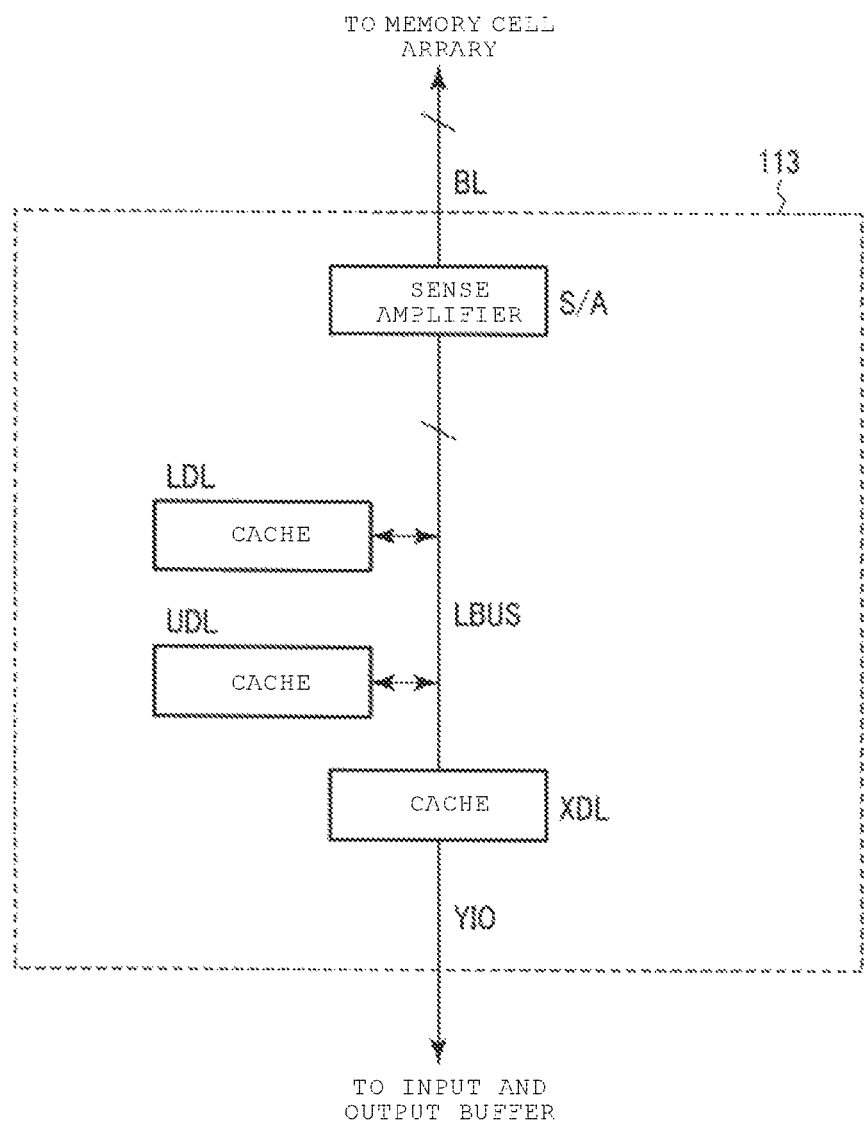
FIG. 4 is a block diagram of a sense unit of the semiconductor memory device according to the first embodiment.

As illustrated in FIG. 4, the sense unit 113 includes a sense amplifier S/A, and a plurality of caches LDL, UDL, and XDL. The caches LDL, UDL, and XDL temporarily store data during writing and the reading. Each of the caches LDL, UDL, and XDL holds data, that is, a data unit for one page. Each bit in the data unit corresponds to, for example, the lower bit or the upper bit which is held by one transistor MT. In addition, each bit in each of the caches LDL, UDL, and XDL is data which is read from one of the transistors MT which shares the word line WL in one string NS, and data which is written into the one of the transistors MT, or data which is associated with the one of the transistors MT.

The sense amplifier S/A, and the caches LDL, UDL, and XDL are connected to each other via an internal bus LBUS, and transmit data to and receive data from each other via the internal bus LBUS. The cache XDL is connected to the selection circuit 118 via the bus, and, transmits data to and receives data from the data buffer 116 and the output buffer 103 via the selection circuit 118. The write data which is input from the input buffer 102 is first stored in the cache XDL.

Distribution of Threshold Voltages of Memory Cell

The distribution of the threshold voltages of the memory cell transistor MT will be described with reference to FIG. 5.

Figure 5:
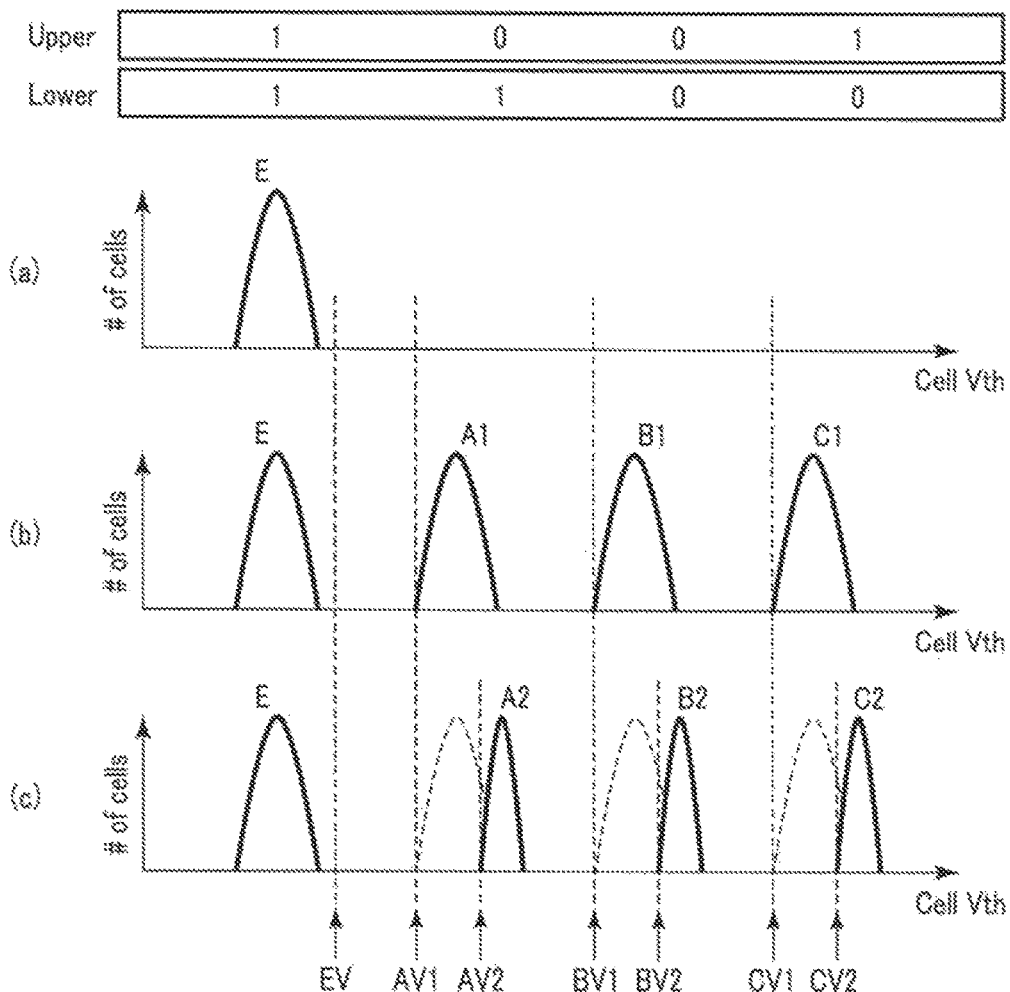
FIG. 5 illustrates a change of distribution of threshold voltages during a writing operation in the semiconductor memory device according to the first embodiment.

As illustrated in section (c) of FIG. 5, when one transistor MT holds 2-bit data, the threshold voltage of each of the memory cell transistors MT attains any one of four values in accordance with the held data. Even when the plurality of transistors MT holding 2-bit data as above, it is possible to attain threshold voltages which are different from each other. For this reason, the threshold voltages are distributed. The distribution of thresholds is referred to as, for example, an E level, an A2 level, a B2 level, and a C2 level. The threshold voltage at the A2 level is greater than the threshold voltage at the E level. The threshold voltage at the B2 level is greater than the threshold voltage at the A2 level, and the threshold voltage at the C2 level is greater than the threshold voltage at the B2 level.

The four levels are associated with four states of 2-bit data. For example, the memory cell transistor MT at the E level is treated to be in a state of holding "11" data. The memory cell transistor MT at the A2 level is treated to be in a state of holding "01" data. The memory cell transistor MT at the B2 level is treated to be in a state of holding "00" data. The memory cell transistor MT at the C2 level is treated to be in a state of holding "10" data.

2. Writing Operation of Data

Next, an example of the writing operation of data into the NAND type flash memory 100 will be described with reference to FIG. 5 and FIGS. 6A and 6B.

First, a general concept of a method of writing data will be described with reference to FIG. 5. The writing of data includes a first operation and a second operation. The state machine 120 executes the first operation and the second operation when receiving one writing command. The different verify voltages are used between the first operation and the second operation. The verify voltage is a voltage, which is supposed to be exceeded by the threshold voltage of the memory cell transistor MT, into which data is written.

Section (a) of FIG. 5 illustrates a state before the writing of data. As illustrated in section (a) of FIG. 5, the transistor MT is at the "E" level. The transistor MT at the "E" level has a threshold voltage lower than a verify voltage EV.

Section (b) of FIG. 5 illustrates an example of a result of the first operation. As illustrated in section (b) of FIG. 5, the transistor MT has the threshold voltage at any one of an "A1" level to a "C1" level. Verify voltages AV1 to CV1 are used in the "verify" of the first operation. The threshold voltage of the transistor MT at the "A1" level is greater than the verify voltage AV1. The threshold voltage of the transistor MT at the "B1" level is greater than the verify voltage BV1. The threshold voltage of the transistor MT at the "C1" level is greater than the verify voltage CV1. Section (c) of FIG. 5 illustrates an example of a result of the second operation. As illustrated in section (c) of FIG. 5, the transistor MT has the threshold voltage at any one of "A2" level to "C2" level. Verify voltages AV2 to CV2 are used in the "verify" of the second operation. The threshold voltage of the transistor MT at the "A2" level is greater than a verify voltage AV2. The threshold voltage of the transistor MT at the "B2" level is greater than a verify voltage BV2. The threshold voltage of the transistor MT at the "C2" level is greater than a verify voltage CV2.

The verify voltage AV2 is greater than the verify voltage AV1. The verify voltage BV2 is greater than the verify voltage BV1. The verify voltage CV2 is greater than the verify voltage CV1.

Meanwhile, as described below in detail, the writing operation of data is suspended and is restarted in some cases, and in the present specification, the writing operation may include a portion until the writing operation of data is suspended, and a portion after the writing operation of data is restarted.

Figure 6A:
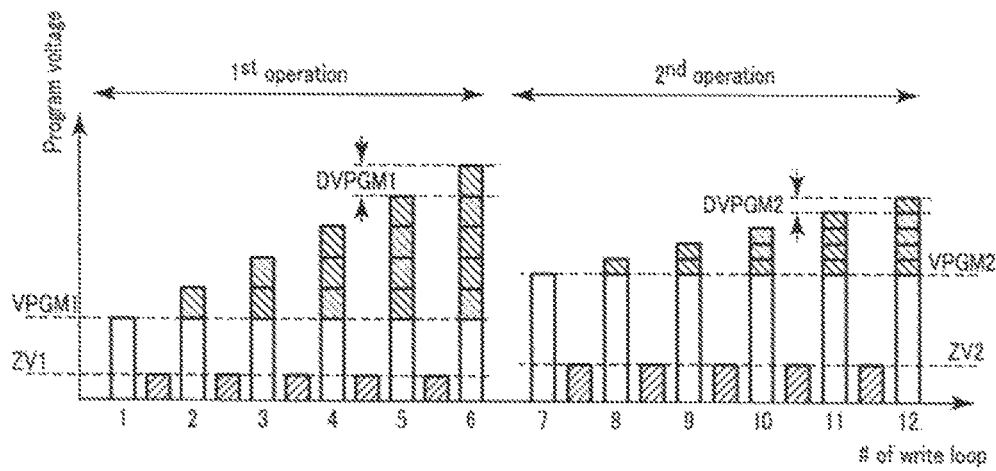
FIGS. 6A and 6B respectively illustrate word line voltage levels applied during the writing operation in the semiconductor memory device, and a flow of the writing operation.

FIG. 6A illustrates a voltage which is applied to the word line WL by the control of the state machine 120 between the first operation and the second operation. The program and the "verify" are performed by alternately applying the program voltage and the verify voltage in each of the first operation and the second operation. In the first operation, the program voltage is stepped up by a value (step-up width) DVPGM1 from a voltage VPGM1 (first initial programing voltage) every time the voltage is applied, by the control of the state machine 120. In the "verify" of the first operation, a voltage ZV1 is applied. The voltage ZV1 is one or more of the verify voltages AV1 to CV1.

In the second operation, the program voltage is stepped up by a value DVPGM2 from a voltage VPGM2 (second initial programing voltage) every time the voltage is applied, by the control of the state machine 120. The voltage VPGM2 is greater than the voltage VPGM1. The value DVPGM2 is smaller than the value DVPGM1. In the "verify" of the second operation, a voltage ZV2 is applied. The voltage ZV2 is any one of the verify voltages AV2 to CV2.

The applying of the program voltage is repeated until the "verify" succeeds, or until reaching the maximum number of repetitions in each of the first operation and the second operation. In a case where a count value obtained by the fail count circuit 125 is equal to or less than the fail reference value F_NF, it is determined that the "verify" succeeds.

The writing operation including the first and the second operations are disclosed in U.S. Pat. No. 8,565,020. The entire contents thereof are incorporated herein by reference.

In order to perform the writing operation described above, 2-bit data is required for each of the transistors MT as a writing target, that is, data is required for two pages. When starting the writing operation, the memory controller 200 transmits data for two pages to the memory 100. The transmitted data is held in any one of the caches LDL, UDL, and XDL, and the memory 100 performs the writing operation with using the held data.

On the other hand, while the NAND type flash memory 100 executes a command of the writing operation from the host device 300 via an instruction of the memory controller 200, the host device 300 commands the memory to perform the suspension of the instructed writing operation in some cases. The suspension is determined by the host device 300, and occurs in a case where the emergency work is necessary for example. The suspended writing operation is restarted later in some cases. However, in a case of the restarting the suspended writing operation, in accordance with the degree of progress until the writing operation is suspended, a portion of the write data or the entire write data in the caches LDL, UDL, and XDL disappears in some cases. This is because the cache may be used not only to hold the write data but also for other uses.

Hereinafter, an operation which is made in circumstance of such a situation will be described.

Flow of Writing Operation

First, the flow of the writing operation of the NAND type flash memory 100 will be described with reference to FIG. 6B.

Figure 6B:
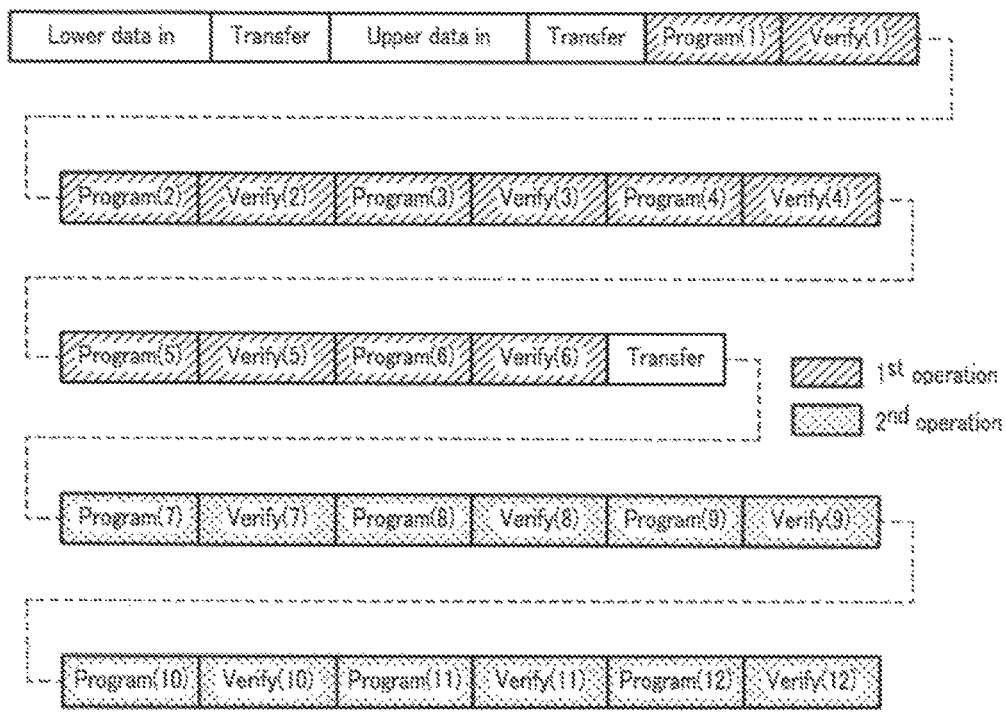

As illustrated in FIG. 6B, when starting the writing operation, the data of the lower page is transmitted to the memory 100 from the memory controller 200 (Lower data in). The data of the lower page is transmitted to any one of the caches LDL, UDL, and XDL (Transfer). Next, in the same way, data of the upper page is transmitted to the memory 100 from the memory controller 200 (Upper data in), and then, transmitted to any one of the caches LDL, UDL, and XDL (Transfer).

Next, the first operation is started. When the loop of the program and the "verify" is repeated twice, for example, for each of the "A1" level to "C1" level (i.e., 6 loops=2 loops×3 levels), the writing at "A1" level to "C1" level is completed. Subsequently, the second operation is started after a preparing period of the second operation passes (Transfer). When the loop of the program and the "verify" is repeated twice, for example, for each of the "A2" level to "C2" level (i.e., 6 loops=2 loops×3 levels), the writing at "A2" level to "C2" level is completed.

Data Storage State of Cache

Next, the storing of data in the caches LDL, UDL, and XDL in a flow of the writing operation in FIG. 6B will be described with reference to FIG. 7 to FIG. 9. The cache which stores the data and a storing timing in the following description are merely an example.

Figure 7:
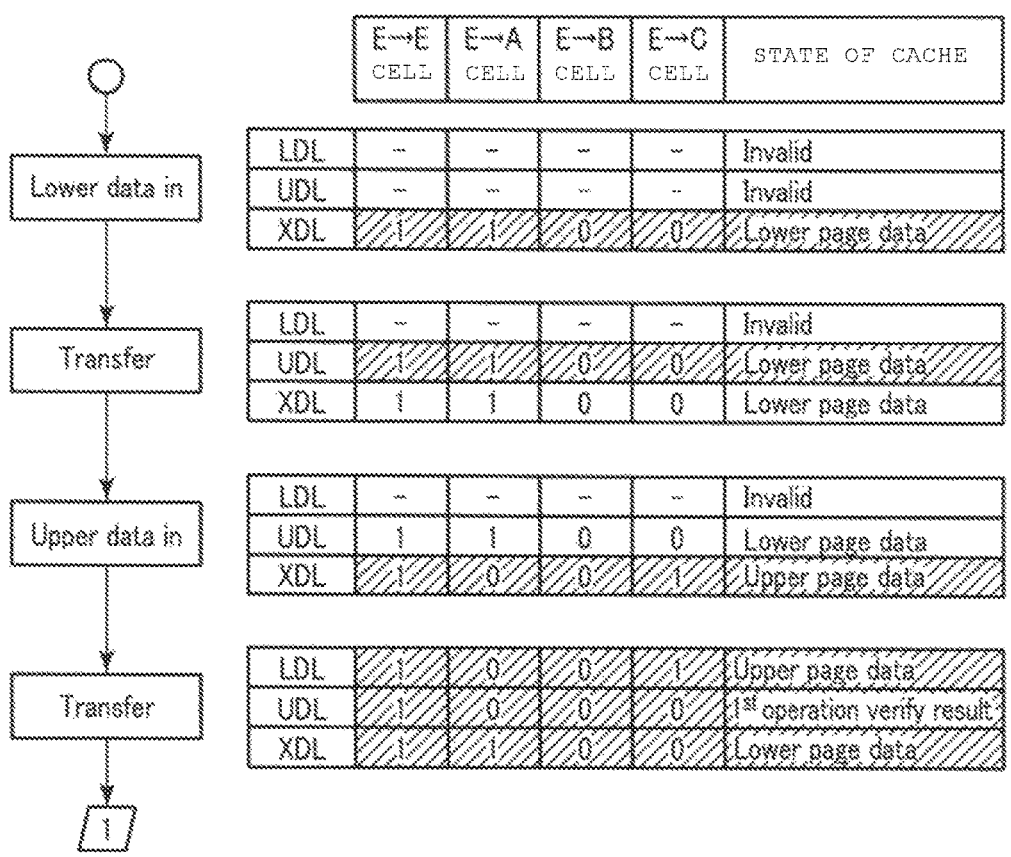
FIGS. 7-9 each illustrate a cache state during the writing operation of the semiconductor memory device according to the first embodiment.
Figure 8:
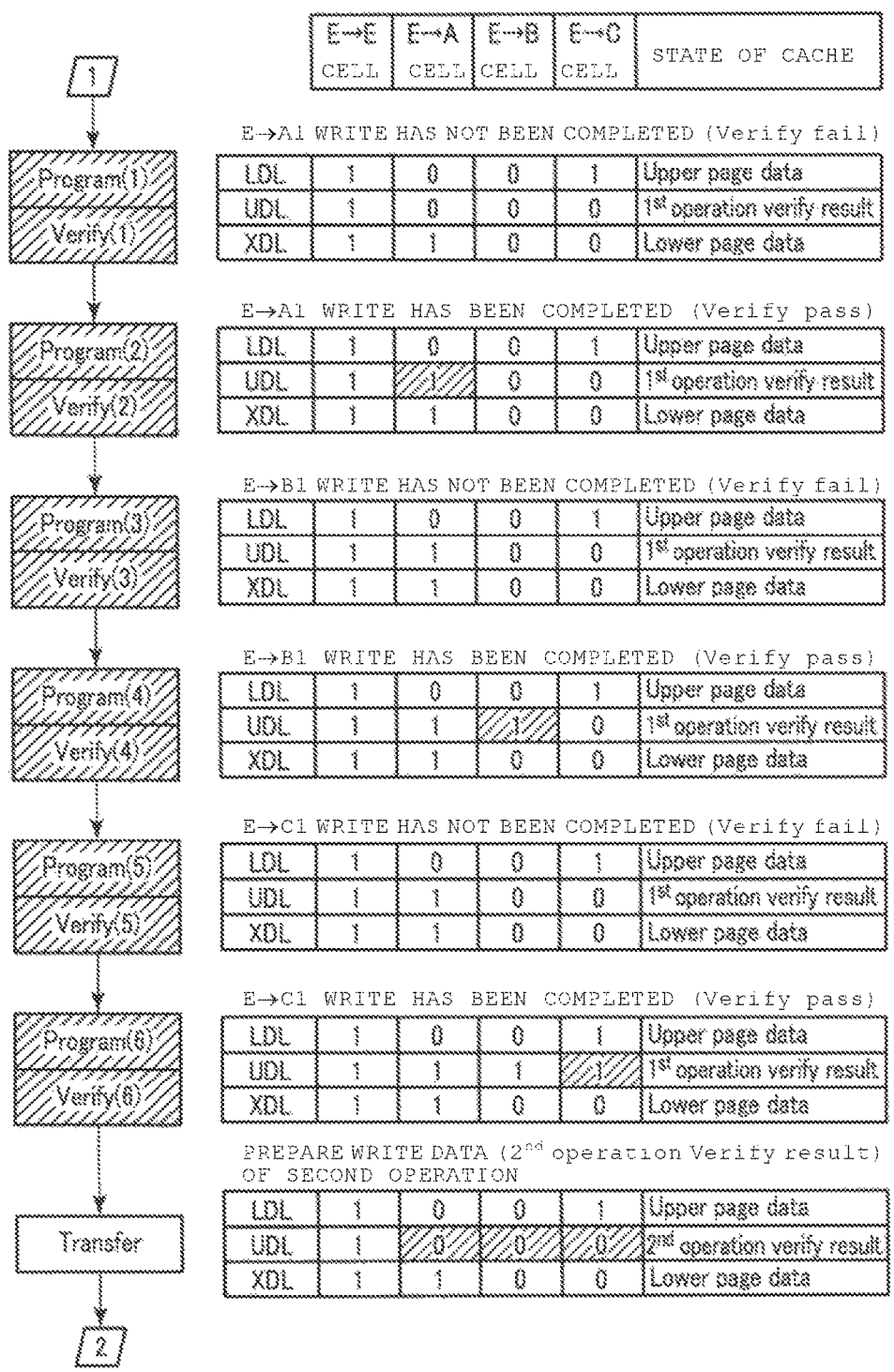
Figure 9:
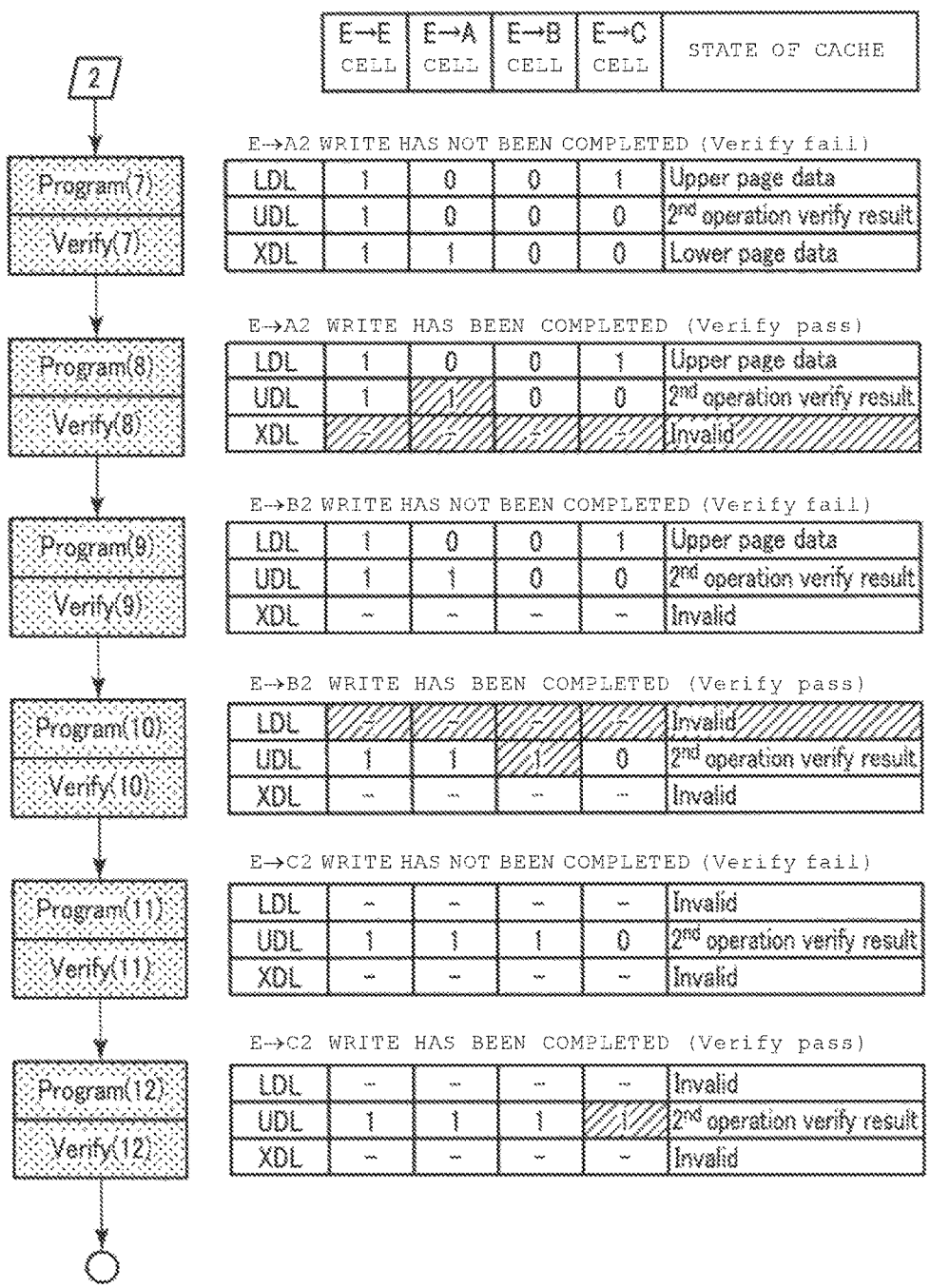

In FIG. 7 to FIG. 9, the stored data is associated with the transistor MT which is kept at the "E" level, and the transistors MT in which data is written at the "A" level, the "B" level, and the "C" level. Each of the caches LDL, UDL, and XDL holds a value which is associated with one of the transistors MT in which the data items are collectively written, in each bit. More specifically, each of the caches LDL, UDL, and XDL holds a value for one cell transistor MT which is kept at the corresponding "E" level, and one cell transistor MT in which the data is written at from the "E" level to the "A" level, the "B" level, or the "C" level, in each bit. However, for the sake of convenience, FIG. 7 to FIG. 9 illustrate that incompletion or completion of the writing of data at the "A" level, the "B" level, or the "C" level is expressed by "0" or FIG. 7 illustrates storage state of data in the caches LDL, UDL, and XDL during a period in which data from the memory controller 200 is transmitted. The following operation is performed by the control of the state machine 120 via the memory cell control register 121.

As illustrated in FIG. 7, when the writing operation is started, the state machine 120 stores data of the lower page in the cache XDL. At the start of the writing operation, the caches LDL and UDL may be in any state (Invalid). The data of the lower page is transmitted to, for example, the cache UDL from the cache XDL by the state machine 120. Now, the cache XDL may receive the data of the upper page, and thus the data of the upper page is stored in the cache XDL. The data of the upper page is transmitted to, for example, the cache LDL from the cache XDL by the state machine 120.

Subsequently, the state machine 120 transmits the data of the lower page in the cache UDL to the cache XDL so as to store the result of the "verify" (determination data) of the first operation in the cache UDL. Specifically, the state machine 120 resets the bits, which are related to the transistors MT into which the data are written at one of the "A1" level to the "C1" level among all bits in the cache UDL, to "0". The bit related to the transistor MT which is kept at the "E" level is "1".

In FIG. 8, the first operation is started. Every time the writing is completed at each of the "A1" level to the "C1" level through the "verify", the value of the data which is written in each transistor MT corresponding to the cache UDL is changed from "0" to "1". In FIG. 8, in the first write loop at the "A1" level (Program (1) and Verify (1), the same applies hereinafter), the value of the data which is written in the transistor MT at the "A1" level in the cache UDL is kept to be "0". This illustrates a state where the "verify" is failed because the transistor MT in which the writing is not completed remains among transistors MT in which the data is written at "A1" level.

In the second write loop at the "A1" level, a determined value of the data which is written in the transistor MT at the "A1" level in the cache UDL is changed to "1". In the drawings and the following description, the change of the determined value as above indicates that the corresponding "verify" succeeds.

Thereafter, every time the "verify" succeeds at the "B1" level and the "C1" level, the value of data written in the transistor MT at the "B1" level and the "C1" level in the cache UDL is sequentially changed from "0" to "1". Owing to this, the first operation is completed.

When the first operation is completed, the state machine 120 resets the value (the result of the "verify" in the first operation) in the cache UDL so as to store the result of the "verify" in the second operation.

In FIG. 9, the second operation is started. Similar to the first operation, every time the "verify" succeeds at the "A2" level, the "B2" level, and the "C2" level, the value of data written in the transistor MT at the "A2" level, the "B2" level, and the "C2" level in the cache UDL is sequentially changed from "0" to "1". Owing to this, the second operation is completed.

Meanwhile, as apparent from FIG. 8 and FIG. 9, before the second operation is started, the data items of the lower and the upper page are held in the caches XDL and LDL so as to be used in the second operation. However, after the second operation is started, there is no need to hold these data items, and the data items are erased in some cases. By erasing the data, it is possible to efficiently use a resource of the memory 100, for example, another data is stored in a vacant cache. For example, in FIG. 9, when the writing at the "A2" level is completed, data of the lower page disappears from the cache XDL. When the writing at the "B2" level is completed, the data of the upper page disappears from the cache LDL.

When the suspended writing operation is restarted in another page, the memory 100 is required to have data for two pages which is received from the memory controller 200. Accordingly, whether or not data disappears during suspending the writing operation, that is, until the writing operation is performed affects on the process after restarting the writing operation.

In the first embodiment, in consideration of the above-described point, the state machine 120 is provided with a register PW1COMP as described above. The register PW1COMP holds the status code CODE_PW1COMP. The status code CODE_PW1COMP has a value based on the situation of the writing operation progress, and accordingly, the status code CODE_PW1COMP has, a value based on timing at which the writing operation is instructed to be suspended. The memory 100 transmits information including the status code CODE_PW1COMP to the memory controller 200 based on the conditions.

Hereinbelow, an example of the status code CODE_PW1COMP will be described separately from the case of different timing of the suspension of the writing operation.

Case where Writing Operation is not Suspended

First, the case where the writing operation is not suspended will be described with reference to FIG. 10 to FIG. 12. In this case, the status code CODE_PW1COMP is not transmitted to the memory controller 200.

Figure 10:
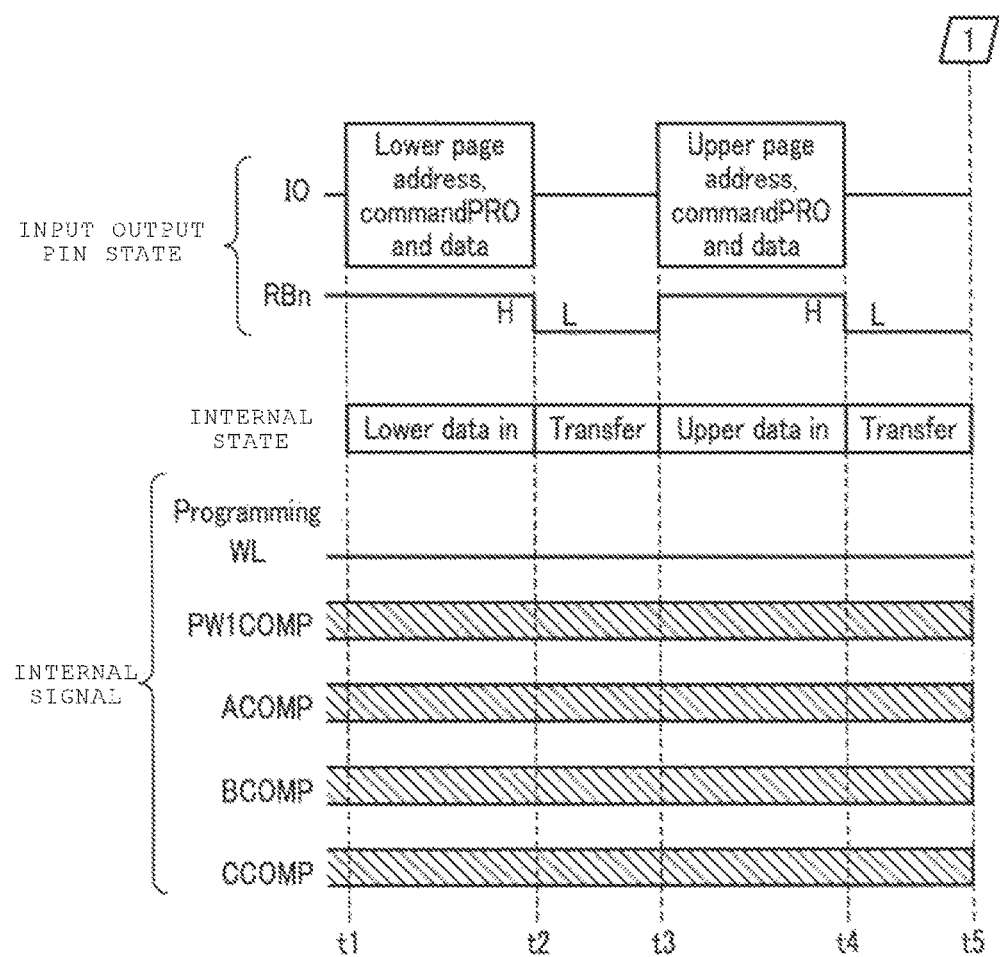
FIGS. 10-12 are each a timing chart of various signals during the writing operation in the semiconductor memory device according to the first embodiment.
Figure 11:
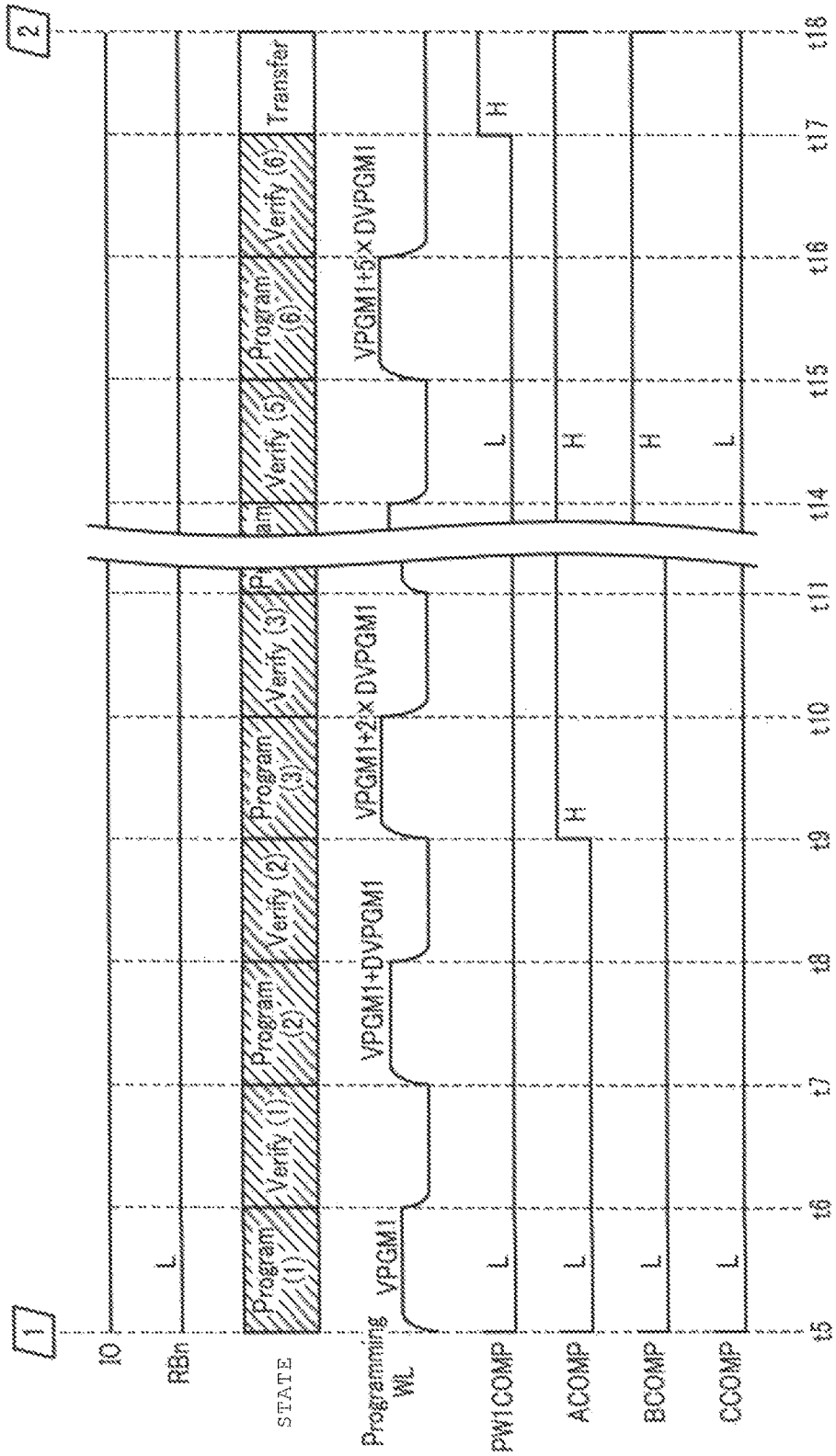
Figure 12:
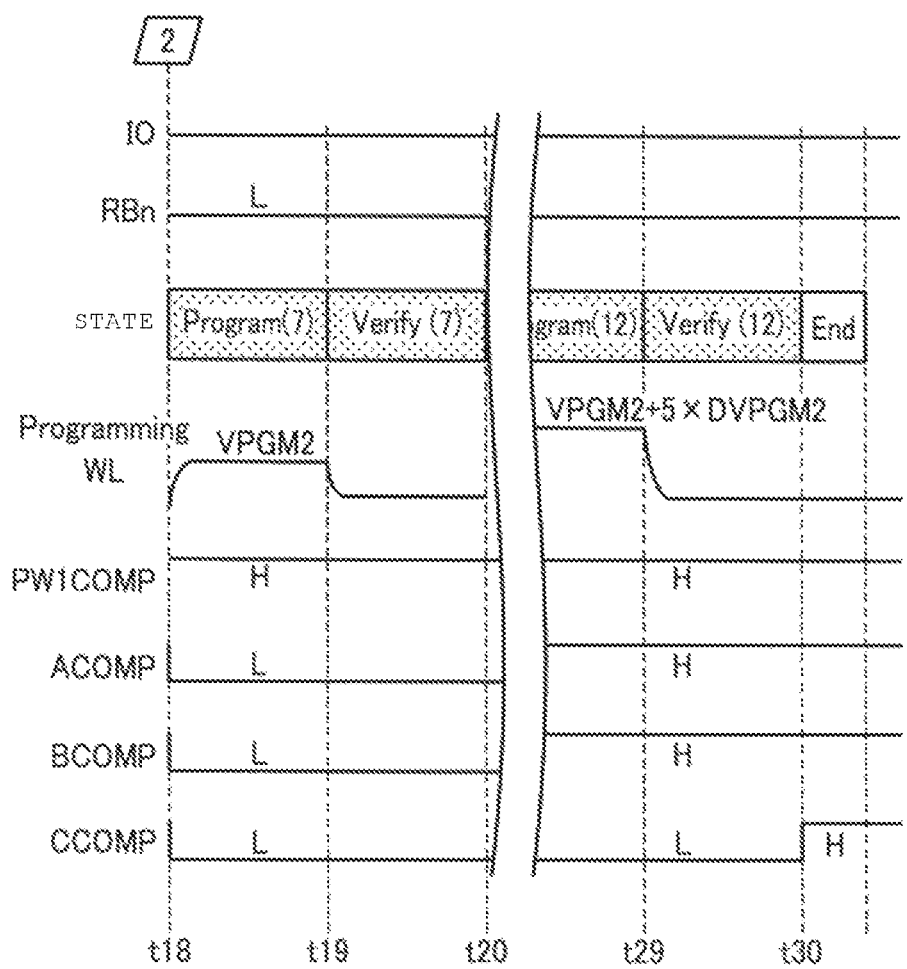

FIG. 10 to FIG. 12 are timing charts of various signals in the writing operation when the writing operation is not suspended. FIG. 10 to FIG. 12 illustrate a wave form of the voltage which is applied to the select word line WL. Note that, the voltage which is applied to the select word line WL in FIG. 10 to FIG. 12 and other similar drawings is merely an example.

The value PW1COMP is a value which is held in the register PW1COMP. The value ACOMP is a value which is held in the register ACOMP. The value BCOMP is a value which is held in the register BCOMP. The value CCOMP is a value which is held in the register CCOMP.

As illustrated in FIG. 10, in time t1, the memory controller 200 transmits a writing command PRO, an address of the lower page of a writing destination, and the write data in the lower page to the memory 100. In time t2, the memory 100 transmits the write data of the lower page to the cache UDL from the cache XDL.

In time t3, the memory controller 200 transmits the writing command PRO, the address of the upper page of the writing destination and the write data to the memory 100. In time t4, the memory 100 transmits the write data of the upper page to the cache LDL from the cache XDL.

The memory 100 outputs a ready/busy signal RBn at "L" level, which indicates "busy" while the data is transmitted in the time t2 and the time t4.

The values PW1COMP, ACOMP, BCOMP, and CCOMP may be at any one of the "L" level and the "H" level while the write data is transmitted to the cache LDL or UDL of the memory 100 from the memory controller 200. In this way, a state where the value does not need to be a certain value is indicated by hatched lines in the drawings.

As illustrated in FIG. 11, the memory 100 starts the first operation from time t5 in accordance with the writing command PRO. Hereinafter, the memory 100 continuously outputs the ready/busy signal RBn at the "L" level until the writing operation is completed or until the memory 100 is in a state in which the next signal may be received from the memory controller 200.

The state machine 120 resets the values PW1COMP, ACOMP, BCOMP, and CCOMP to be at the "L" level when the first operation is started. In addition, the state machine 120 controls the row decoder 112 or the like to sequentially apply the voltage, which is increased by the value DVPGM1 from the voltage VPGM1, to the select word line WL, and then the writing at the "A1" level to "C1" level is sequentially performed.

The state machine 120 sets the value ACOMP to be at the "H" level when the writing at the "A1" level is completed. According to an example in FIG. 11, in time t9, the value ACOMP is set to be at the "H" level. The state machine 120 sets the value BCOMP to be at the "H" level when the writing at the "B1" level is completed. According to the example in FIG. 11, in time t13 (not shown), the value BCOMP is set to be at the "H" level. The state machine 120 sets the value PW1COMP to be at the "H" level when the first operation is completed in accordance with the completion of the writing at the "C1" level. According to the example in FIG. 11, in time t17, the value PW1COMP is set to be at the "H" level.

In time t18, the state machine 120 prepares for the second operation, and resets the values ACOMP and BCOMP to be at the "L" level. On the other hand, the state machine 120 keeps the value PW1COMP to be at the "H" level.

As illustrated in FIG. 12, the memory 100 starts the second operation in accordance with the writing command PRO from the time t18.

The state machine 120 controls the row decoder 112 or the like to sequentially apply the voltage, which is increased by the value DVPGM2 from the voltage VPGM2, to the select word line WL, and then the writing is sequentially performed at the "A2" level to "C2" level.

The state machine 120 sets the value ACOMP to be at the "H" level when the writing at the "A2" level is completed, and sets the value BCOMP to be at the "H" level when the writing at the "B2" level is completed. The state machine 120 sets the value CCOMP to be at the "H" level when the second operation is completed in accordance with the completion of the writing at the "C2" level. According to an example in FIG. 12, in time t30, the value CCOMP is set to be at the "H" level.

In the manner mentioned above, the writing operation is completed.

Case where First Operation is Suspended

When the host device 300 instructs the memory controller 200 to suspend the writing operation, the memory controller 200 performs a process of suspending the writing operation.

Hereinafter, a flow of the writing operation when the memory 100 is instructed to suspend the first operation will be described with reference to FIG. 13 and FIG. 14.

Figure 13:
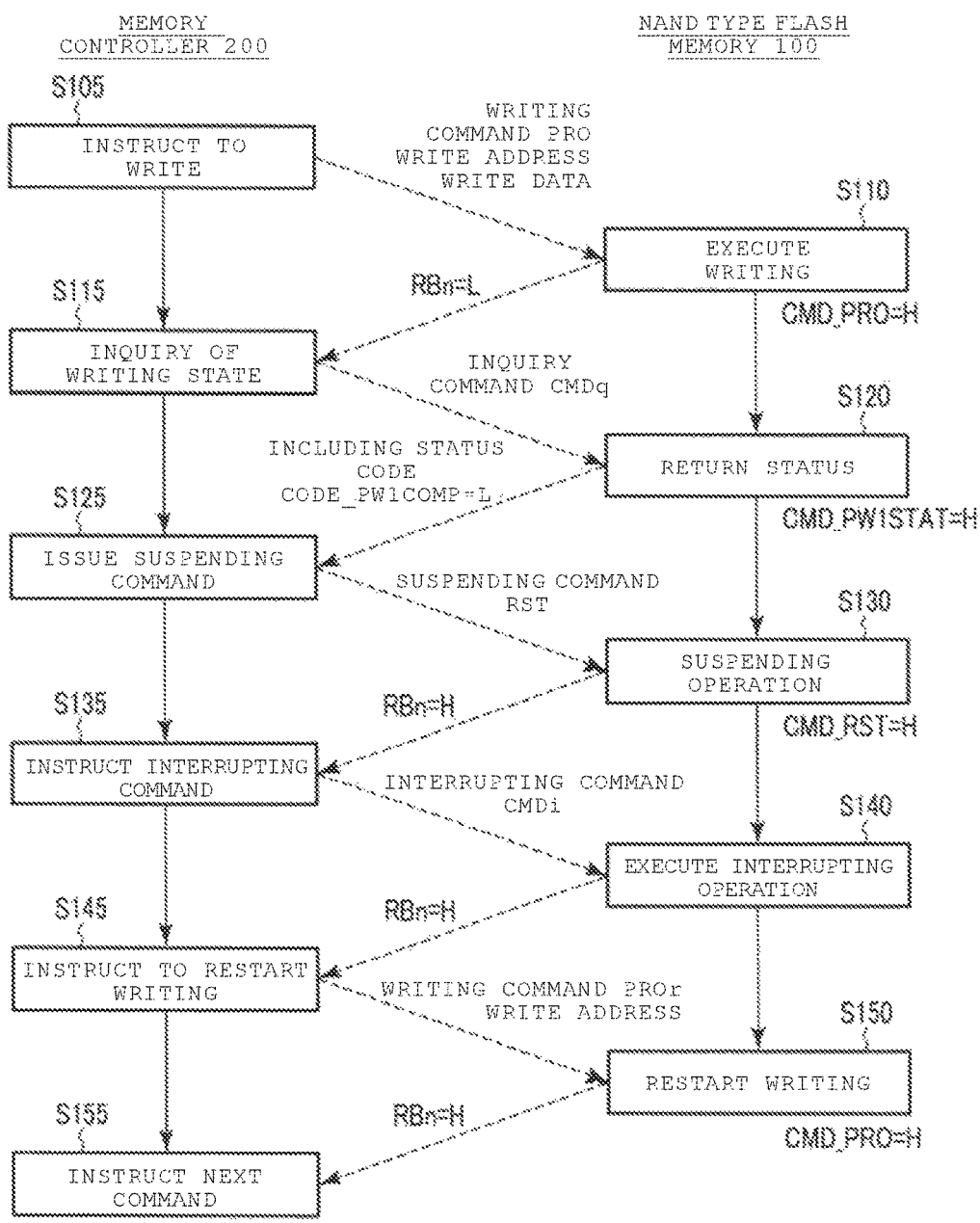
FIG. 13 is a diagram illustrating a flow of tasks between a memory controller and the semiconductor memory device during a first operation in the semiconductor memory device according to the first embodiment.

As illustrated in FIG. 13, in step S105, the memory controller 200 transmits the writing command PRO, the address of the writing destination, and the write data to the memory 100. The write data includes data of the lower page and data of the upper page. Step S105 corresponds to the operation which is performed from the time t1 to the time t5 in FIG. 10.

In step S110, the memory 100 executes the writing operation in accordance with the signal CMD_PRO at the "H" level. The signal CMD_PRO at the "H" level is based on the fact that the memory 100 receives the writing command PRO, and instructs the writing. In response to a start of the writing operation, the memory 100 transmits the ready/busy signal RBn at the "L" level to the memory controller 200.

It is assumed that the memory controller 200 starts the suspension of the writing operation during the fifth "verify" (time t14 to time t15). In response to the start of suspension, as illustrated in FIG. 14, the memory controller 200 performs inquiry of the writing state (step S115 in FIG. 13). For this reason, the memory controller 200 transmits an inquiry command CMDq to the memory 100.

The command decoder 115 transmits, based on the fact that the memory 100 receives the inquiry command CMDq, the signal CMD_PW1STAT at the "H" level to the state machine 120 in a rising edge of the write enable signal WEn. As a result, the state machine 120 outputs the value in the register PW1COMP as the status code CODE_PW1COMP, and transmits the status code CODE_PW1COMP to the output buffer 103 by the selection circuit 117. The status code CODE_PW1COMP is at the "L" level based on the fact that the state machine 120 receives the signal CMD_PW1SAT in the first operation.

After the time t15, the memory controller 200 transmits the asserted read enable signal REn to the memory 100, and the memory 100 transmits various status codes to the memory controller 200 as an IO signal (step S120 in FIG. 13). The status code to be transmitted includes the status code CODE_PW1COMP.

From the fact that the status code CODE_PW1COMP is at the "L" level, the memory controller 200 detects that the first operation is in process when the memory 100 receives at least the inquiry command CMDq. Accordingly, the memory controller 200 detects that the data for two pages which is previously transmitted is still held in any one of the caches LDL, UDL, and XDL. From the above description, the memory controller 200 detects that it is possible to start the suspending operation without retransmitting the write data or standby of the progress of the writing operation.

Since it is possible to start the suspension, in time t16, the memory controller 200 transmits a suspending command RST to the memory 100 (step S125 in FIG. 13). Note that, the memory 100 may or may not keep the value PW1COMP therein after receiving the suspending command RST. In this way, the fact that the value PW1COMP may or may not be held in the memory 100 is indicated by the hatched lines in the drawings.

The command decoder 115 transmits the signal CMD_RST which is at the "H" level to the state machine 120 based on the fact that the memory 100 receives the suspending command RST (step S130 in FIG. 13). The signal CMD_RST at the "H" level instructs the suspension (stop) of the writing operation. When receiving the instruction, the state machine 120 stops the writing by performing the process for the writing operation (for example, initialization of a state of an element which is related to the writing).

When the state machine 120 completes the process for stopping the writing operation, in time t17, the memory 100 goes into a ready state. Thus, the memory controller 200 transmits an interrupting operation command CMDi to the memory 100 (step S135 in FIG. 13). The interrupting operation command CMDi is, for example, a read command of a certain data of the lower page, and follows designation of an address of a read source.

The memory 100 which receives the interrupting operation command CMDi may be the memory 100 which suspends the writing operation, and may be another memory 100 which is connected to the memory controller 200. In the memory 100 which suspends the writing operation, for example, a memory cell of which the address is different from that of the memory cell in which the writing operation is suspended becomes a target of an interrupting operation. The operation which is capable of interrupting the writing operation is, for example, determined. Any operation is capable of interrupting as long as the operation does not destroy data which is held in the memory 100.

In the time t18, the memory 100 executes the interrupting operation in accordance with the interrupting operation command CMDi (step S140 in FIG. 13). Based on the example in which the interrupting operation is the reading operation, the memory 100 transmits read data to the memory controller 200 in accordance with the read enable signal REn. The interrupting operation is completed, for example, by time t19. The memory 100 returns to be in the ready state when during starting the transmission of the read data.

Based on at least a part of the fact that the memory 100 returns to the ready state, the memory controller 200 detects that it is possible to restart the suspended writing operation.

Accordingly, the memory controller 200 transmits a writing command PROr and the address of the writing destination to the memory 100 in the time t19 after receiving the read data, for example (step S145 in FIG. 13).

Since the data for two pages is still held in the caches XDL, UDL, and LDL, the memory controller 200 does not transmit the write data. Unlike the typical writing command PRO, the writing command PROr instructs the write without accompanying the output of the write data. A transmission destination of the writing command PROr is a memory 100 which suspends the writing operation. The address of the write destination may be the same as or different from the address of the memory cell which is a writing target before being suspended.

From time t20, the state machine 120 performs preparation (Transfer) for the restart of the writing operation. Next, in time t21, the state machine 120 restarts the writing operation based on the writing command PROr with using the data in the caches XDL, UDL, and LDL (step S150 in FIG. 13). The restarted writing operation is started from the first write loop of the first operation in the same manner as the typical writing operation. Here, in a case where the address of the rewriting destination is the same as that before the writing operation is suspended, rewriting may be performed to continue the writing operation before being suspended.

In a case where the writing operation in the memory 100 is completed and the memory 100 is in the ready state, the memory controller 200 instructs the memory 100 to perform the next operation (step S155 in FIG. 13).

Case where Second Operation is Suspended

Figure 15:
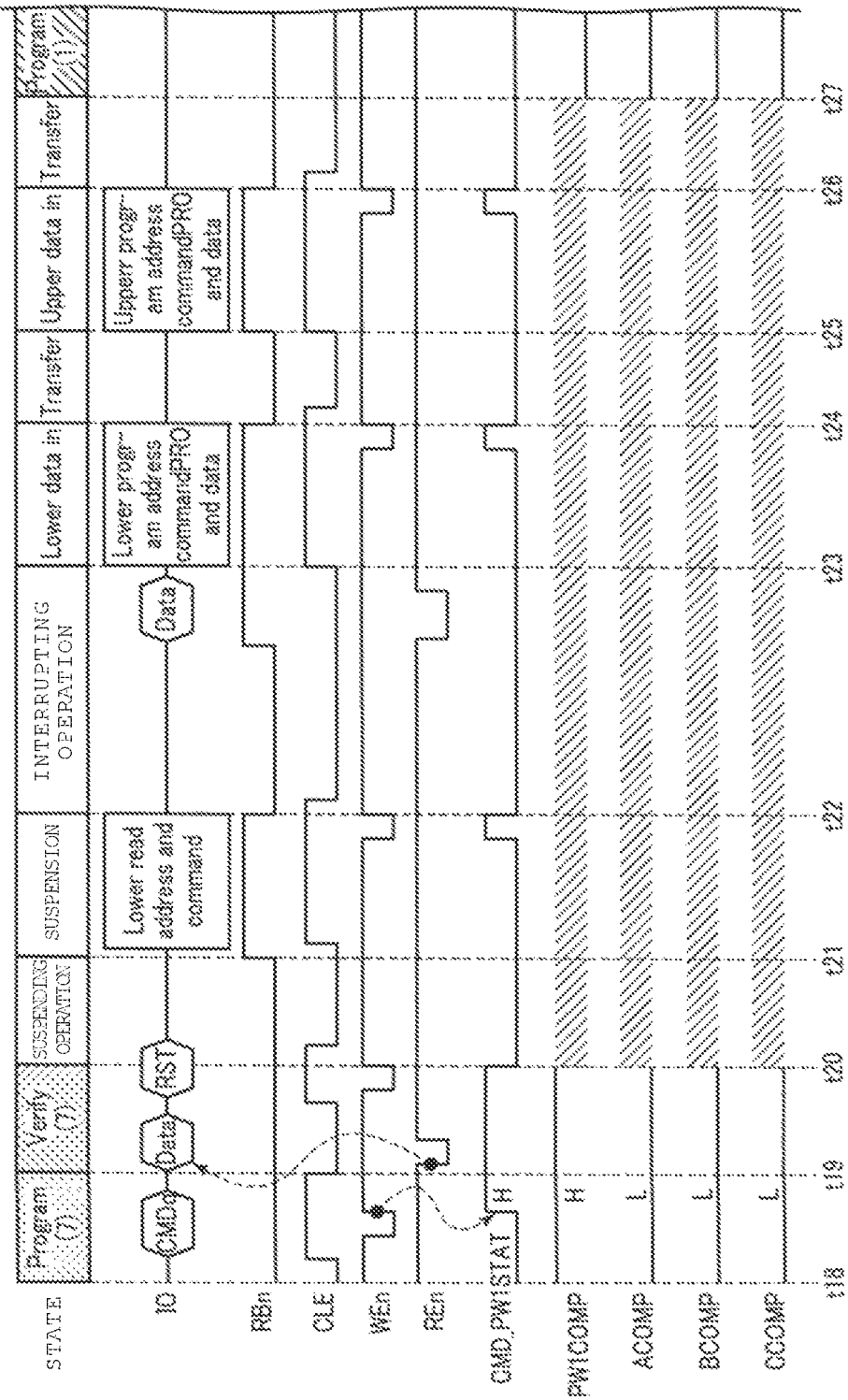
FIG. 15 is a timing chart of various signals during a second operation in the semiconductor memory device according to the first embodiment.

Next, with reference to FIG. 15, a flow of the writing operation in a case where the second operation is suspended will be described.

It is assumed that the memory controller 200 starts the suspension in the writing operation during the first "verify" of the second operation (time t18 and time t19). In response to the start of suspension, as illustrated in FIG. 15, the memory controller 200 transmits the inquiry command CMDq to the memory 100.

The command decoder 115 transmits the signal CMD_PW1STAT at the "H" level to the state machine 120 based on the fact that the memory 100 receives the inquiry command CMDq. As a result, various pieces of information which includes the status code CODE_PW1COMP are transmitted to the memory controller 200 by being selected in the selection circuit 117. The status code CODE_PW1COMP is at the "H" level based on the fact that the state machine 120 receives the signal CMD_PW1STAT in the second operation.

Since the status code CODE_PW1COMP is at the "H" level, the memory controller 200 detects that the second operation is in process when the memory 100 receives at least the inquiry command CMDq. Accordingly, the memory controller 200 detects that a portion or the entire data items for two pages are likely to disappear in any one of the caches XDL, UDL, and LDL.

Figure 14:
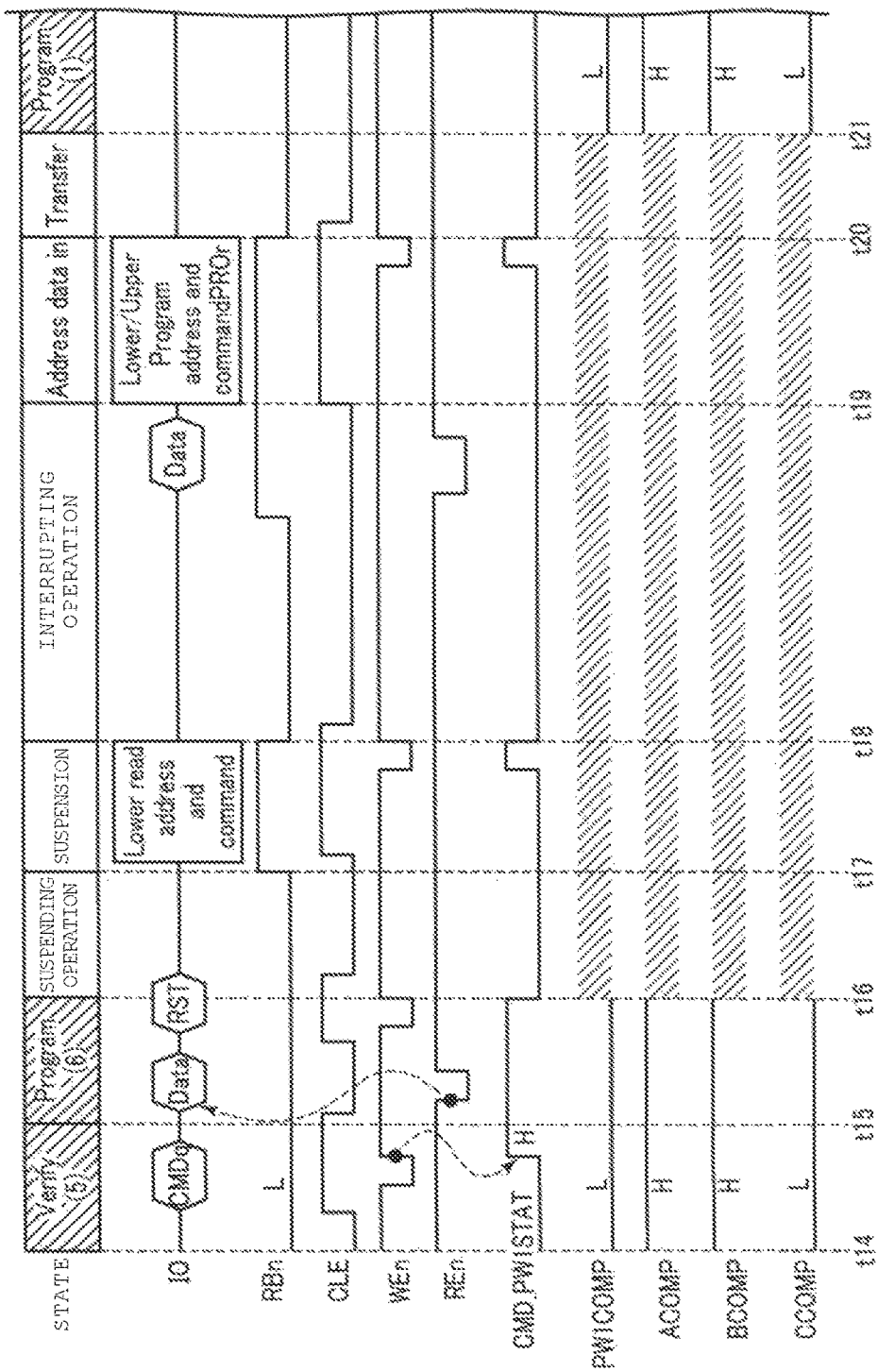
FIG. 14 is a timing chart of various signals during the first operation in the semiconductor memory device according to the first embodiment.

The suspending operation and the interrupting operation during a period of time t20 to time t23 are the same as the operation during a period of the time t16 to the time t19 in the first operation in FIG. 14. The interrupting operation is, for example, a reading operation, and is completed by the time t23, for example. The memory 100 returns to be in the ready state with starting the transmission of the read data.

Based on at least a part of the fact that the memory 100 returns to be in the ready state, the memory controller 200 detects that it is possible to restart the suspended writing operation. Accordingly, the memory controller 200 transmits, for example, in the time t23 after receiving the read data, the writing command PRO, and the addresses of the upper page and the lower page of the writing destination to the memory 100 in which the writing operation is suspended. Since it is likely that the write data disappears in the memory 100, the memory controller 200 retransmits the write data items for the upper page and the lower page.

In time t27, the state machine 120 restarts the writing operation based on the writing command PRO with using the write data which is received again.

The first embodiment describes an example that when the memory controller 200 instructs the memory 100 to suspend the writing operation, the writing operation is suspended and the process causing the suspension is performed, but the invention is not limited to this example. The memory controller 200 may determine whether to actually perform the suspension in the writing operation or not after outputting the status code CODE_PW1COMP, in consideration of the state of the writing operation in the memory 100, or the contents, the importance, and the urgency of the cause of the suspension. For example, the memory controller 200 may determine that the suspension in the writing operation is not performed in the second operation, but performed in the first operation.

3. Effects According to First Embodiment

According to the first embodiment, when the memory 100 receives the inquiry command CMDq in the first operation, the state machine 120 transmits the status code CODE_PW1COMP at the "L" level to the memory controller 200. The state machine 120 transmits the status code CODE_PW1COMP at the "H" level to the memory controller 200 when the memory 100 receives the inquiry command CMDq in the second operation. With such a configuration, it is possible to obtain one or a plurality of effects as follows.

(A) The memory controller 200 is capable of detecting the status of the writing operation progress so as to suspend the writing operation of the memory 100. Accordingly, the memory controller 200 may determine whether or not the output of the data to the memory 100 again is necessary so as to restart the writing operation.

(B) The memory controller 200, when the writing operation is suspended in the first operation, is not required to transmit the write data again to the memory 100. Therefore, it is possible to reduce the time for retransmitting the write data.

For example, the NAND type flash memory 100 in the comparative example does not have a function of notifying the progress state of the writing operation. For this reason, in order to restart the writing operation, for example, the write data is constantly retransmitted. The time required to write data for one page is, for example, 1,000µ second. During this time, the time required to transmit data to the memory from the memory controller is, for example, 100µ second. When the data is unnecessarily retransmitted despite the remaining data in the memory, the time corresponding to 10% of the total write time is wasted.

According to the first embodiment, in a case where the memory 100 still holds the write data, the memory controller 200 does not retransmit the write data. As a result, it is possible to reduce the time corresponding to 10% of the total write time, and to reduce the occupation time of a bus for transmitting signals IO. Therefore, it is possible to improve the utilization efficiency of the memory 100, and it is possible to achieve efficiency of the entire memory system 10.

(C) The memory controller 200 may have many alternatives, for example, the memory controller 200 starts the suspending operation in the first operation, and does not start the suspending operation in the second operation. Accordingly, the memory controller 200 flexibly performs a process of various commands or the like from the host device 300, whereby it is possible to enhance the working efficiency of the entire memory system 10.

(D) The memory controller 200 may control the memory 100 not to suspend the writing operation in the second operation, for example. Based on the above description, the memory controller 200 does not need to back up the write data until the writing operation is completed in case the data retransmission is needed. Accordingly, it is possible to efficiently use a resource (for example, a buffer memory 204) of the memory controller 200.

4. Modification Example of First Embodiment

The modification example is based on another example of the writing operation. The modification example will be described with reference to FIG. 16 to FIG. 18.

When the NAND type flash memory 100 starts the writing operation, the memory may receive only data for one page (for example, the lower page) in some cases. This may be caused when there are many commands waiting for the process by the memory controller 200 while the various commands or the like from the host device 300 are processed. In this case, for example, the memory controller 200 starts to write only the data of the lower page before transmitting data for one page (for example, the upper page). An operation of writing the data of the lower page is, for example, referred to as lower write. The lower write is instructed by a command which is different from the command indicating the first operation and the second operation. A method of performing the lower write and the writing of the data of the upper page after the lower write is referred to as an LM write method. On the other hand, as illustrated in FIG. 4, a method of writing in a state where the data of the lower page and the upper page is held is referred to as a full sequence method, for example.

Figure 16:
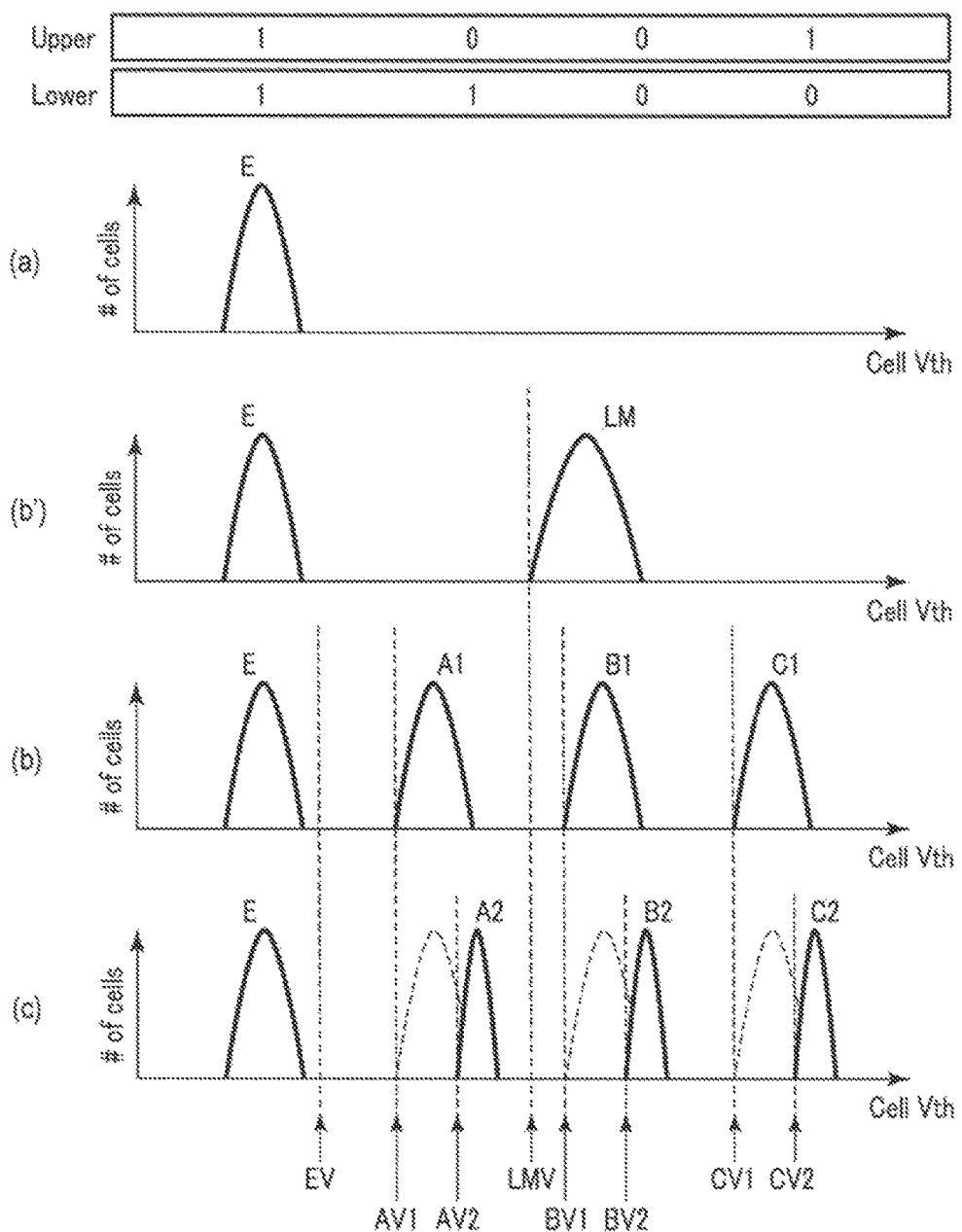
FIG. 16 illustrates a change of distribution of threshold voltages during the writing operation in the semiconductor memory device according to a modification example of the first embodiment.

A state after the lower write is illustrated in section (b') of FIG. 16. A step of section (b') of FIG. 16 is inserted into the writing operation which is described in Modification Example, and thus is different from the writing operation in FIG. 4. The threshold voltage of the memory cell transistor MT is increased due to the lower write, and the memory cell transistor MT is at "LM" level or stays at the "E" level. The threshold voltage of the transistor MT at the "LM" level is greater than a verify voltage LMV. The verify voltage LMV is, for example, greater than a verify voltage AV1 and smaller than a verify voltage BV1.

The memory 100 performs the first and second operations by receiving the data of the upper page after the lower write as in FIG. 4.

In Modification Example, the method of the writing operation is switched from the LM write method to the full sequence method.

Flow of Writing Operation

Figure 17:
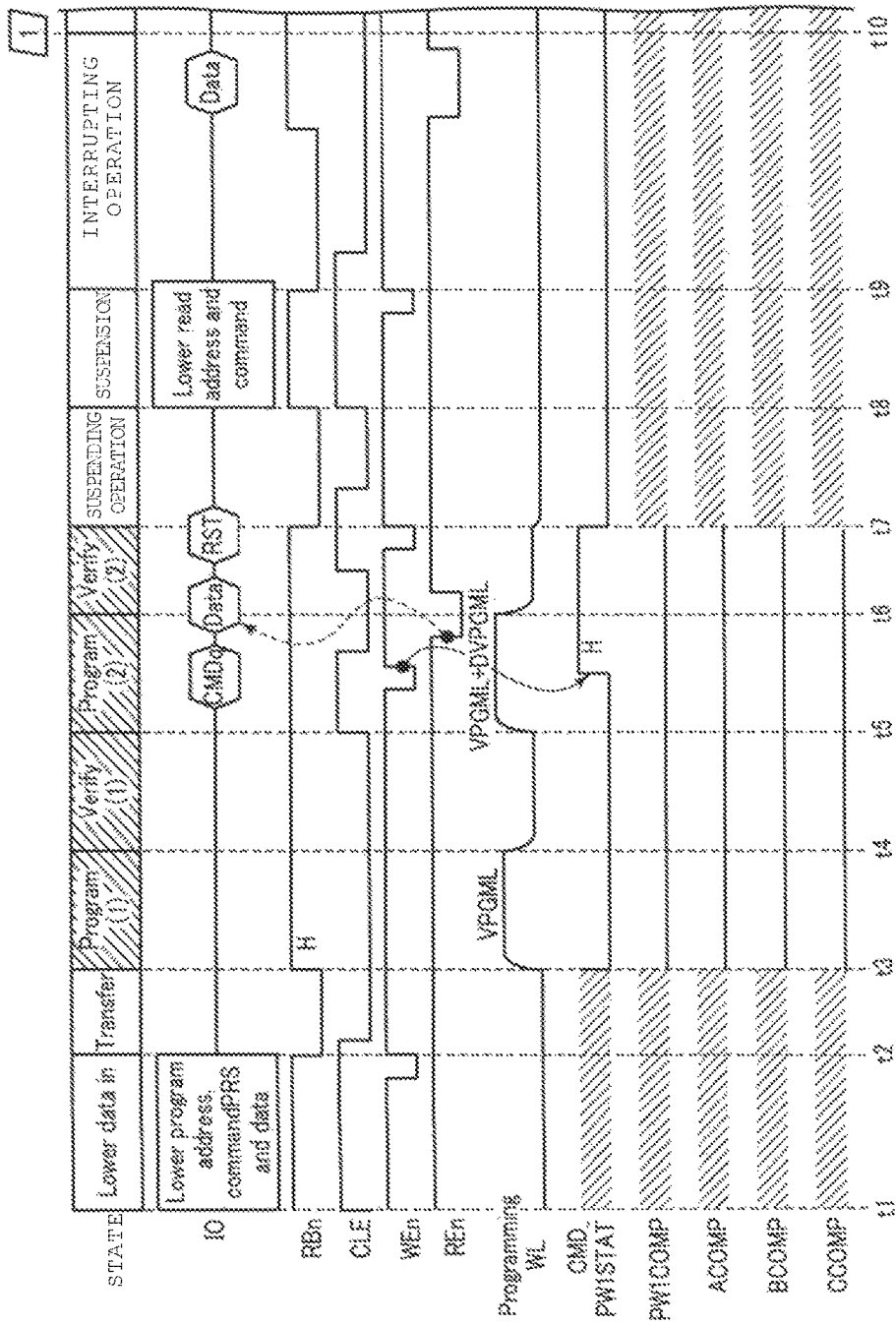
FIGS. 17-18 are each a timing chart of various signals during the writing operation in the semiconductor memory device according to the modification example of the first embodiment.
Figure 18:
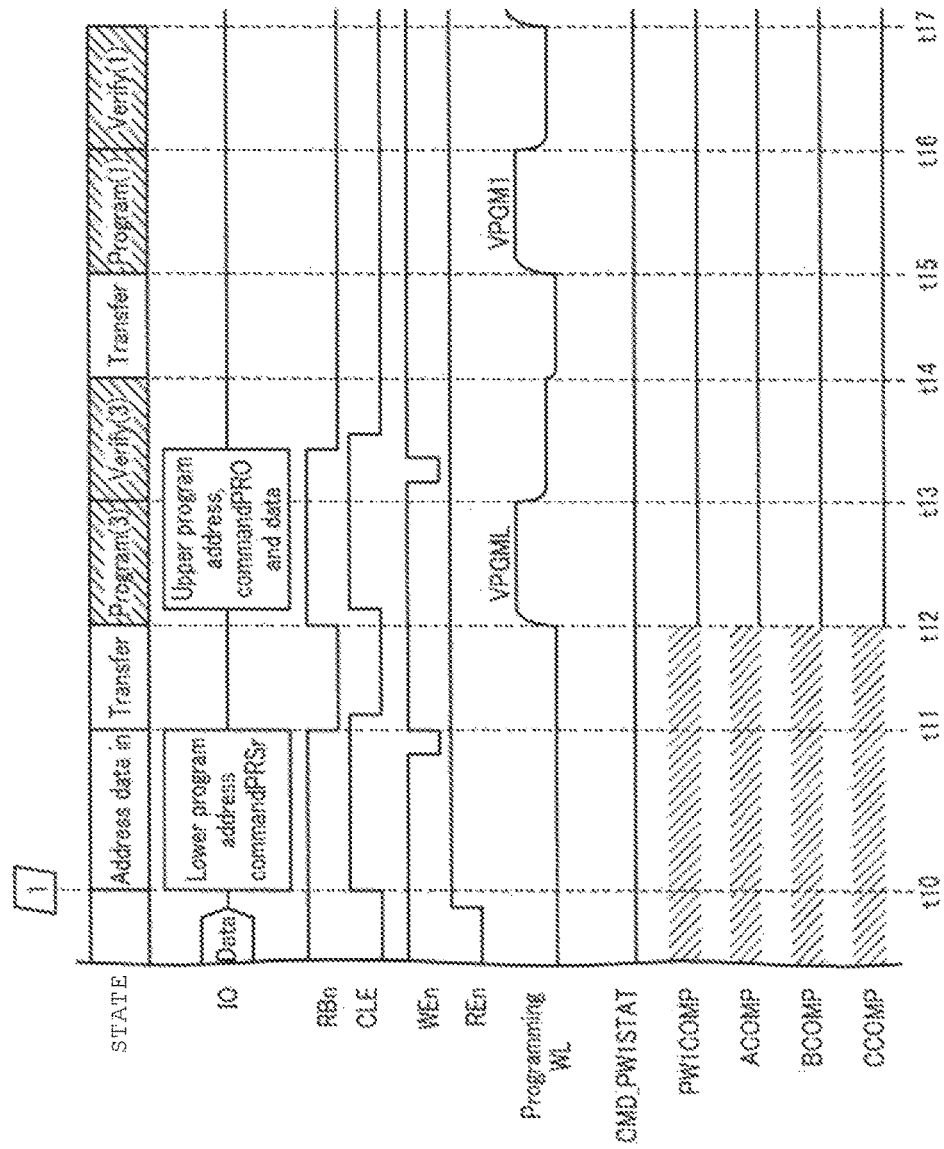

FIG. 17 and FIG. 18 illustrate a flow of the writing operation when the lower write is suspended.

As illustrated in FIG. 17, in the time t1, the memory controller 200 transmits the writing command PRS, the address of the lower page of the writing destination, and the write data to the memory 100. The writing command PRS which instructs the writing of the data for one page is different from the writing command PRO which instructs the writing through the full sequence method. When receiving the command PRS and the write data, the state machine 120 transmits the write data of the lower page to the cache UDL from the cache XDL in the time t2.

Based on the writing command PRS, the state machine 120 starts the write loop of the lower write from the time t3. In the lower write, the program voltage, whenever being applied, is stepped up from the voltage VPGML by the value DVPGML by the control of the state machine 120. The voltage VPGML is smaller than, for example, the voltage VPGM2 in the second operation. The voltage VPGML may be equal to or less than the voltage VPGM1, or may be equal to or greater than the voltage VPGM1 in the first operation. The value DVPGML is greater than, for example, the value (step-up width) DVPGM2 in the second operation. The value DVPGML may be equal to or less than the step-up width DVPGM1, or may be equal to or greater than the step-up width DVPGM1 in the first operation.

The write data is only for one page in the lower write, and thus not all of the caches are occupied. For this reason, the memory 100 is capable of receiving the next data from the memory controller 200. Accordingly, in the lower write, the state machine 120 transmits the ready/busy signal RBn at the "H" level to the memory controller 200.

It is assumed that the memory controller 200 starts to suspend the writing operation in the second program loop (time t5 and time t6). In response to the start of the suspension, the memory controller 200 transmits the inquiry command CMDq to the memory 100.

The command decoder 115 transmits the signal CMD_PW1STAT at the "H" level to the state machine 120 based on the fact that the memory 100 receives the inquiry command CMDq. As a result, in the time t6, the various pieces of information which includes the status code CODE_PW1COMP are transmitted to the memory controller 200 from the memory 100. The state machine 120 continuously stores data of the lower page in any one of the caches XDL, UDL, and LDL so as to be capable of switching the LM write method to the full sequence method in the lower write after obtaining the data of the upper page. Accordingly, during the lower write, the value PW1COMP stays at the "L" level, and the status code CODE_PW1COMP is also at the "L" level.

The memory controller 200 detects that the memory 100 holds the write data of the lower page when the memory 100 receives the inquiry command CMDq based on the fact that the status code CODE_PW1COMP at the "L" level is received. From the above description, the memory controller 200 detects that it is possible to start the suspending operation.

Since it is possible to start the suspension, the memory controller 200 transmits the suspending command RST to the memory 100. After the time t7, similar to FIG. 14 and FIG. 15, the memory 100 executes the suspending operation and the interrupting operation. The interrupting operation is, for example, a reading operation, and the memory 100 returns in the ready state with starting the transmission of the read data.

Based on at least a part of the fact that the memory 100 returns to be in the ready state, the memory controller 200 detects that it is possible to restart the suspended writing operation. Accordingly, as illustrated in FIG. 18, the memory controller 200 outputs a writing command PRSr and the address of the writing destination to the memory 100 in which the writing operation is suspended in the time t10 after receiving the read data. The memory controller 200 does not transmit the write data. This is because that the caches XDL, UDL, and LDL still hold the data of the lower page. Unlike the typical writing command PRS, the writing command PRSr instructs the write of data for one page without accompanying the output of the data. The address of the write destination may be the same as or different from the address of the memory cell which is a writing target before being suspended.

From the time t11, the state machine 120 performs preparation (Transfer) for the restart of the writing operation. Next, in the time t12, the state machine 120 restarts the writing operation based on the writing command PRSr with using the data in the caches XDL, UDL, and LDL.

On the other hand, in the time t12, the memory controller 200 is in a state of capable of outputting the data of the upper page. Here, the memory controller 200 transmits the writing command PRO, the address of the writing destination, and the write data to the memory 100 in the writing operation.

Since the data of the lower page is still held in caches XDL, UDL, or LDL even at the time t12, the memory controller 200 transmits only the data of the upper page to the memory 100 and does not output the data of the lower page. It is necessary that addresses of the block BLK, the string unit SU, and the word line WL of the writing destinations are the same as that of the memory cell in the writing operation.

The memory 100 starts the writing operation through the full sequence method based on the fact that the writing command PRO is received. The writing operation is performed in the same manner as, for example, the operation illustrated in FIG. 11 and FIG. 12. Further, when the cause of a new suspension has occurred, the memory 100 and the memory controller 200 may perform the same operation as the operation illustrated in FIG. 14 or FIG. 15, for example.

As described above, according to Modification Example, the configuration of the signal CMD_PW1STAT, the status code CODE_PW1COMP, or the like is applicable to the writing operation of which the method is switched from the LM write method to the full sequence method.

Second Embodiment

Next, a NAND type flash memory 150 and a memory controller 250 according to the second embodiment will be described with reference to FIG. 19 to FIG. 22. The second embodiment is different from the first embodiment in that a data hold suspending command is provided between the memory controller and the memory.

1. Configuration of Memory System

In the second embodiment, the memory controller 250 is capable of outputting the data hold suspending command RSVRST in addition to the elements, the operations, and the functions of the memory controller 200 in the first embodiment. When the memory controller 250 is instructed to suspend the writing operation from the host device 300, for example, during the writing operation in the memory 150, the memory controller 250 transmits data hold suspending command RSVRST to the memory 150. The data hold suspending command RSVRST instructs the suspension after completing the first operation when the memory 150 which receives this data hold suspending command RSVRST is in the first operation.

Figure 19:
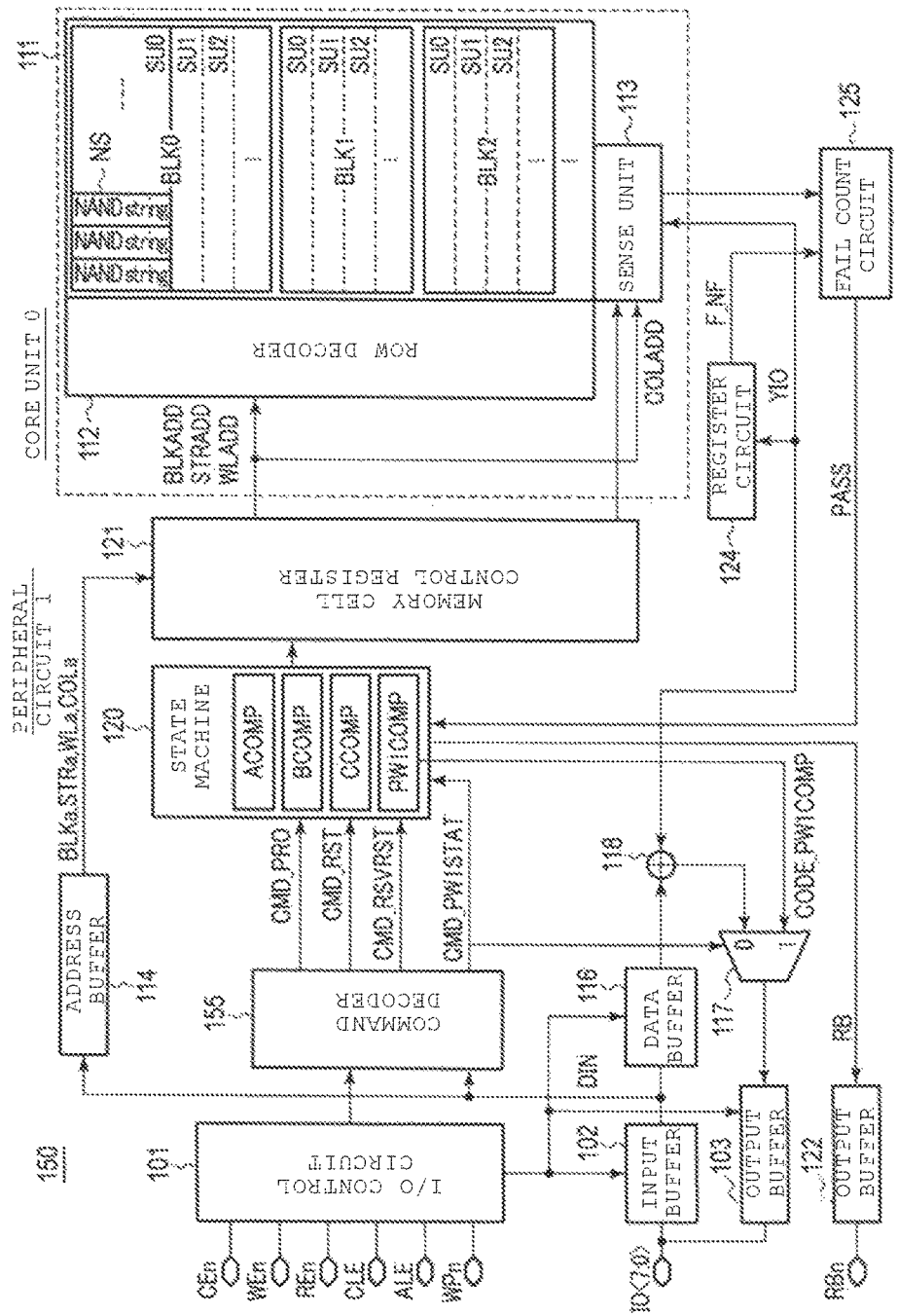
FIG. 19 is a block diagram of a semiconductor memory device according to a second embodiment.

The memory 150 has a configuration illustrated in FIG. 19. The memory 150 includes a command decoder 155 in the peripheral circuit 1. The command decoder 155 is capable of outputting, for example, the signal CMD_RSVRST, in addition to the elements, the operations, and the functions of the command decoder 115 in a case where the data signal DIN includes the data hold suspending command RSVRST. The signal CMD_RSVRST informs the state machine 120 of the fact that the memory 150 receives the data hold suspending command RSVRST. The signal CMD_RSVRST is set to be at the "H" level based on the fact that the memory 150 receives the data hold suspending command RSVRST. The command decoder 155 receives the signal CMD_RSVRST at the "H" level and stores that fact with using, for example, a register. The state machine 120 adjusts a timing of suspending the writing operation in response to the stage of the writing operation, in which the signal CMD_RSVRST at the "H" level is received.

Other functions of the command decoder 155 are the same as those of the command decoder 115 in the above-described embodiment.

For other configurations, the description of the first embodiment entirely corresponds to that in the second embodiment.

2. Writing Operation of Data

Next, an example of the writing operation of data to the NAND type flash memory 150 will be described.

Case where First Operation is Suspended

First, a flow of the writing operation in a case where the host device 300 instructs the memory controller 250 to suspend the first operation in the memory 150 will be described with reference to FIG. 20 and FIG. 21.

Figure 20:
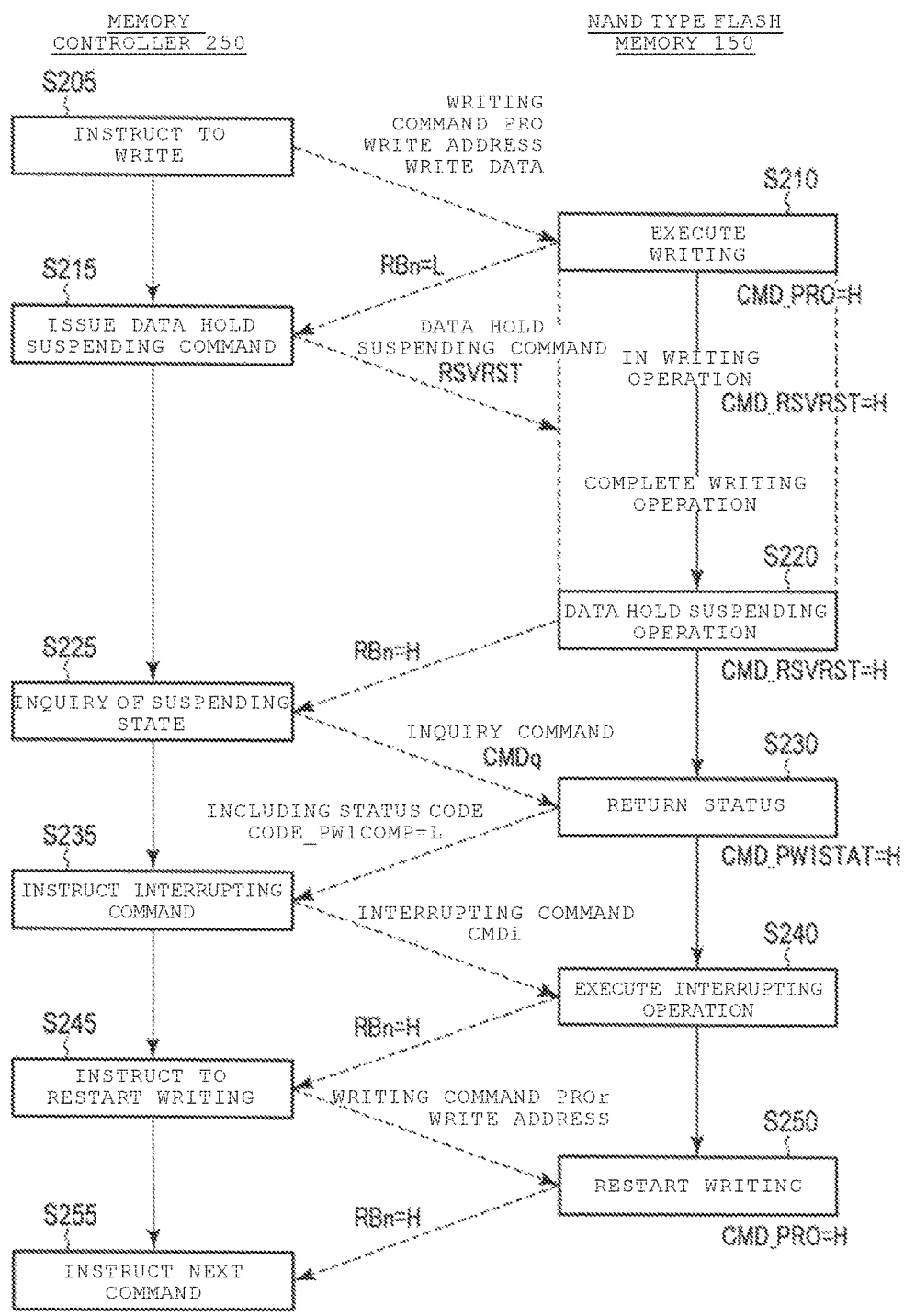
FIG. 20 is a diagram illustrating a flow of tasks between a memory controller and the semiconductor memory device during a first operation in the semiconductor memory device according to the second embodiment.

As illustrated in FIG. 20, the memory controller 250 transmits the writing command PRO, the address of the writing destination and the write data to the memory 150 (step S205). In accordance with the writing command PRO, the memory 150 performs the writing operation (step S210). Step S210 includes the program (step S211), the verify (step S212), and the confirmation of the completion of the first operation (step S213), as illustrated in FIG. 21. A set of steps S211 to S213 is repeated until the first operation is completed.

A subsequent flow is different based on the stage of the writing operation, in which the memory 150 receives the data hold suspending command RSVRST. First, a case where the memory 150 receives the data hold suspending command RSVRST in the first operation will be described. That is, as illustrated in FIG. 20, the memory controller 250 transmits the data hold suspending command RSVRST to the memory 150 in the first operation (step S215). Even in this case, the memory 150 continuously performs the first operation to completion. When the first operation is completed, the state machine 120 performs the data hold suspending operation (step S220). In the data hold suspending operation, the state machine 120 determines whether or not the signal CMD_RSVRST at the "H" level is received in the first operation (step S220 in FIG. 21). The state machine 120 detects that the signal CMD_RSVRST at the "H" level is received in the first operation, and suspends the writing operation. As a result, the memory 150 transitions to the ready state.

The memory controller 250 receives the fact that the memory 150 is in the ready state, and transmits the inquiry command CMDq to the memory 150 (step S225). Based on the fact that the memory receives the inquiry command CMDq, the state machine 120 transmits the status code CODE_PW1COMP to the memory controller 250 (step S230). The status code CODE_PW1COMP is kept at the value (here, "L" level) at the time when the memory 150 receives the data hold suspending command RSVRST, and the state machine 120 receives the signal CMD_RSVRST at the "H" level. Accordingly, the memory controller 250 detects that the memory 150 receives the data hold suspending command RSVRST in the first operation, and then suspends the writing operation without starting the second operation after completing the first operation. As a result, the memory controller 250 detects that the memory 150 still holds the data for two pages.

The interrupting operations in subsequent steps S235 to S240 is the same as the operations in steps S135 to S140 in FIG. 13. When completing the interrupting operation, the memory controller 250 transmits the writing command PROr and the address of the writing destination to the memory 150 (step S245). The memory controller 250 does not retransmit the write data. The address of the writing destination may be the same as the address of the memory cell which is a writing target before the writing operation is suspended.

The state machine 120 restarts the writing operation based on the writing command PROr (step S250). Step S250 includes the program (step S251), the "verify" (step S252), and the confirmation of the completion of the second operation (step S253), as illustrated in FIG. 21. A set of steps S251 to S253 is repeated until the second operation is completed. When the second operation is completed and the memory 150 is in the ready state, the memory controller 250 instructs the memory 150 to perform the next operation (step S255).

Figure 21:
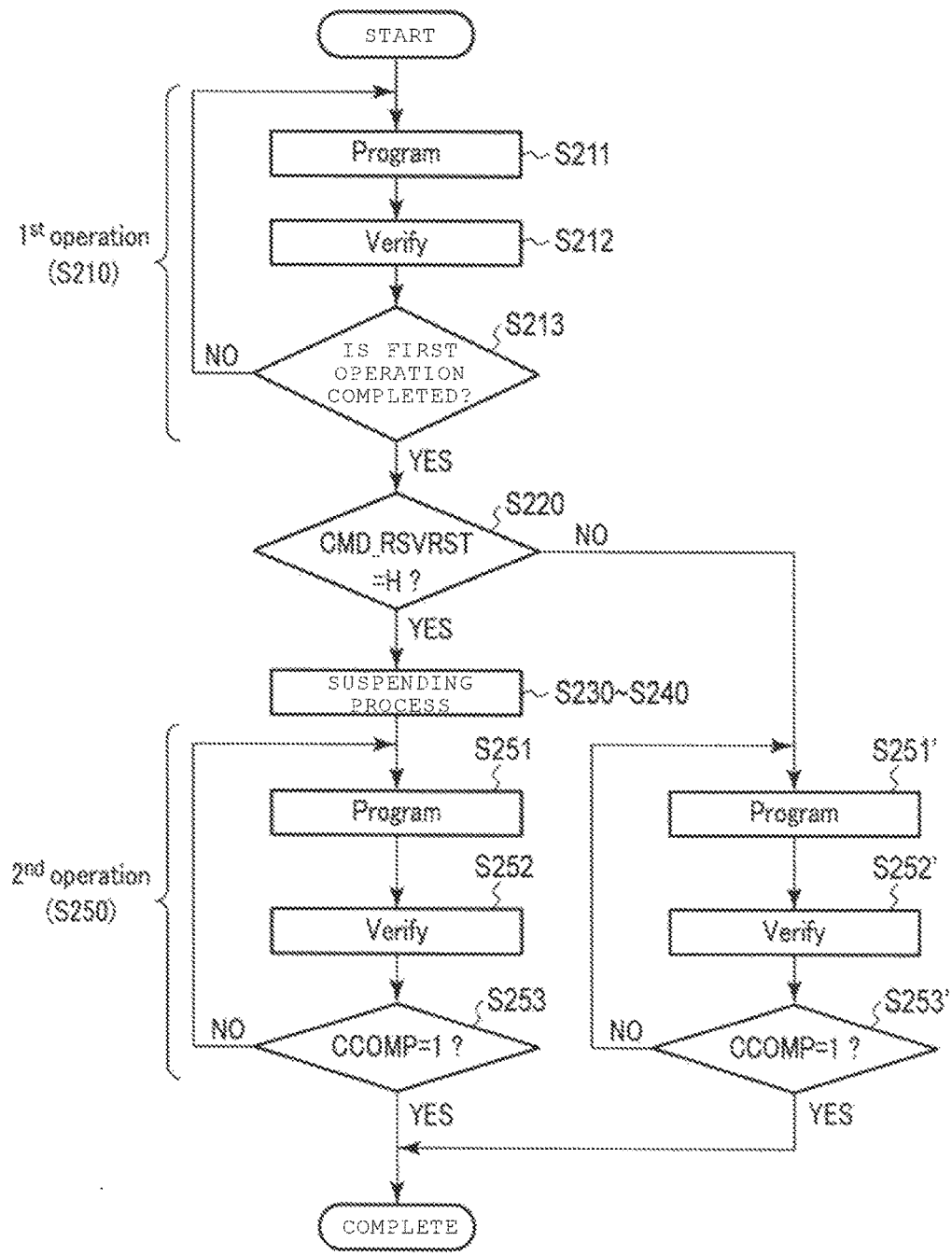
FIG. 21 is a flowchart of the writing operation in the semiconductor memory device according to the second embodiment.

On the other hand, in a case where the memory 150 does not receive the data hold suspending command RSVRST in the first operation, the state machine 120 detects that fact by determination in step S220 in FIG. 21. In this case, the state machine 120 executes the second operation (steps S251' to S253'). That is, the program and the "verify" are repeated until the value CCOMP becomes "1", and when the value CCOMP becomes "1", the writing is completed.

In this way, in a case where the memory controller 250 transmits the data hold suspending command RSVRST to the memory 150 in the first operation of the memory 150, the time taken from the transmission of the command until the writing operation is suspended is longer than the time when the suspending command RST is used. This is because the first operation is continuously performed.

When the memory controller 250 is instructed by the host device 300 to suspend the writing operation, the memory controller 250 transmits the suspending command RST instead of the data hold suspending command RSVRST. The memory controller 250 determines the command to be transmitted in consideration of the emergency of cause of the suspension, and the entire state of the memory system 10.

Case where Second Operation is Suspended

Next, a flow of the writing operation in a case where the host device 300 instructs the memory controller 250 to suspend the second operation in the memory 150 will be described with reference to FIG. 22.

Figure 22:
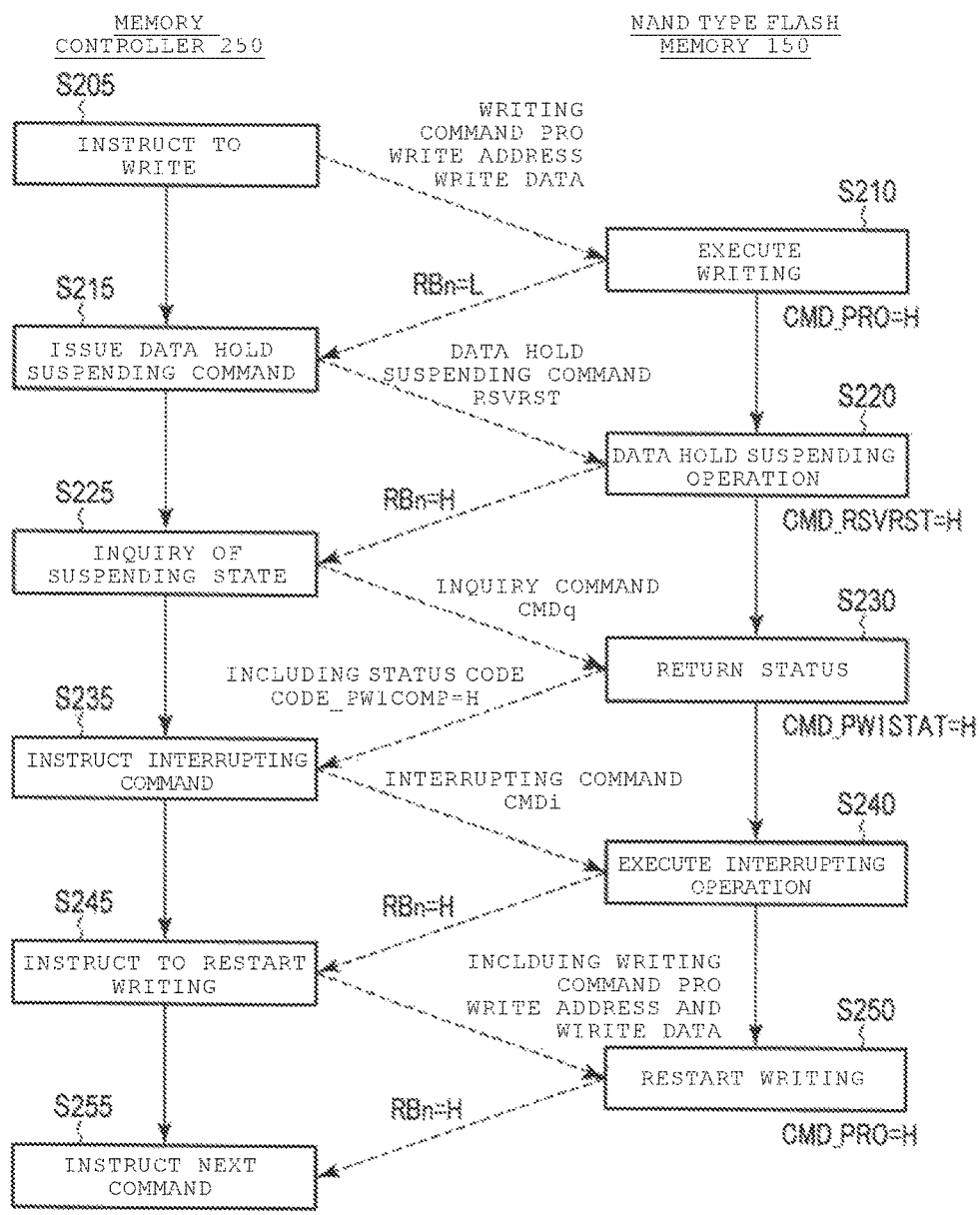
FIG. 22 is a diagram illustrating a flow of tasks between the memory controller and the semiconductor memory device during a second operation in the semiconductor memory device according to the second embodiment.

As illustrated in FIG. 22, the memory controller 250 transmits the data holding suspending command RSVRST to the memory 150 (step S215). It is assumed that the step S215 is performed in the second operation of the memory 150. Based on the fact that the memory 150 receives the data hold suspending command RSVRST, the state machine 120 receives the signal CMD_RSVRST at the "H" level and determines the timing of receiving the signal CMD_RSVRST (step S220). As described in the example, when the state machine 120 receives the signal CMD_RSVRST at the "H" level in the second operation, the state machine 120 suspends the writing operation during receiving the signal CMD_RSVRST at the "H" level.

Thereafter, steps S225 and S230 are performed. The status code CODE_PW1COMP transmitted in step S230 is the "H" level. Accordingly, the memory controller 250 detects that the memory 150 receives the data hold suspending command RSVRST in the second operation, the writing operation is suspended, and a portion or the entire data items for two pages disappear in any one of the caches XDL, UDL, and LDL.

In the subsequent step S245 after the interrupting operation, the memory controller 250 transmits the writing command PRO, the address of the writing destination, and the write data to the memory 150 when restarting the writing operation. The address of the write destination may be the same as or different from the address of the memory cell which is a writing target before being suspended.

3. Effects According to Second Embodiment

According to the second embodiment, when the memory 150 receives the data hold suspending command RSVRST in the first operation, the state machine 120 continuously performs the writing operation until the first operation is completed, and suspends the writing operation after the first operation is completed. With such a configuration, it is possible to obtain one or a plurality of effects as follows.

(A) Since the first operation is completed at the time when the writing operation is suspended, the memory cell transistor MT of the writing target is at any one of the "A1" level to the "C1" level in response to the write data. The reliability of such a state is deteriorated as compared with a state in which the second operation is performed, but is sufficient for a state in which data is temporarily held in some cases. For this reason, it is possible to perform the interrupting operation while the data is temporarily held in the memory cell transistor MT.

(B) In a case where the writing is restarted with respect to the same transistor MT as that before suspending the writing operation, the memory 150 may restart the writing operation from the first of the second operation. It is easy to manage and execute the process in the above case as compared with a case where the writing is restarted in the middle of the first operation or the second operation. In addition, it is possible to avoid performing the unnecessary first operation again, and thus to shorten the writing time.

(4) Modification Example of Second Embodiment

Modification Example relates to an operation of restarting the writing operation in a case where a memory 160 receives the data hold suspending command RSVRST in the first operation. Modification Example will be described with reference to FIG. 23.

Figure 23:
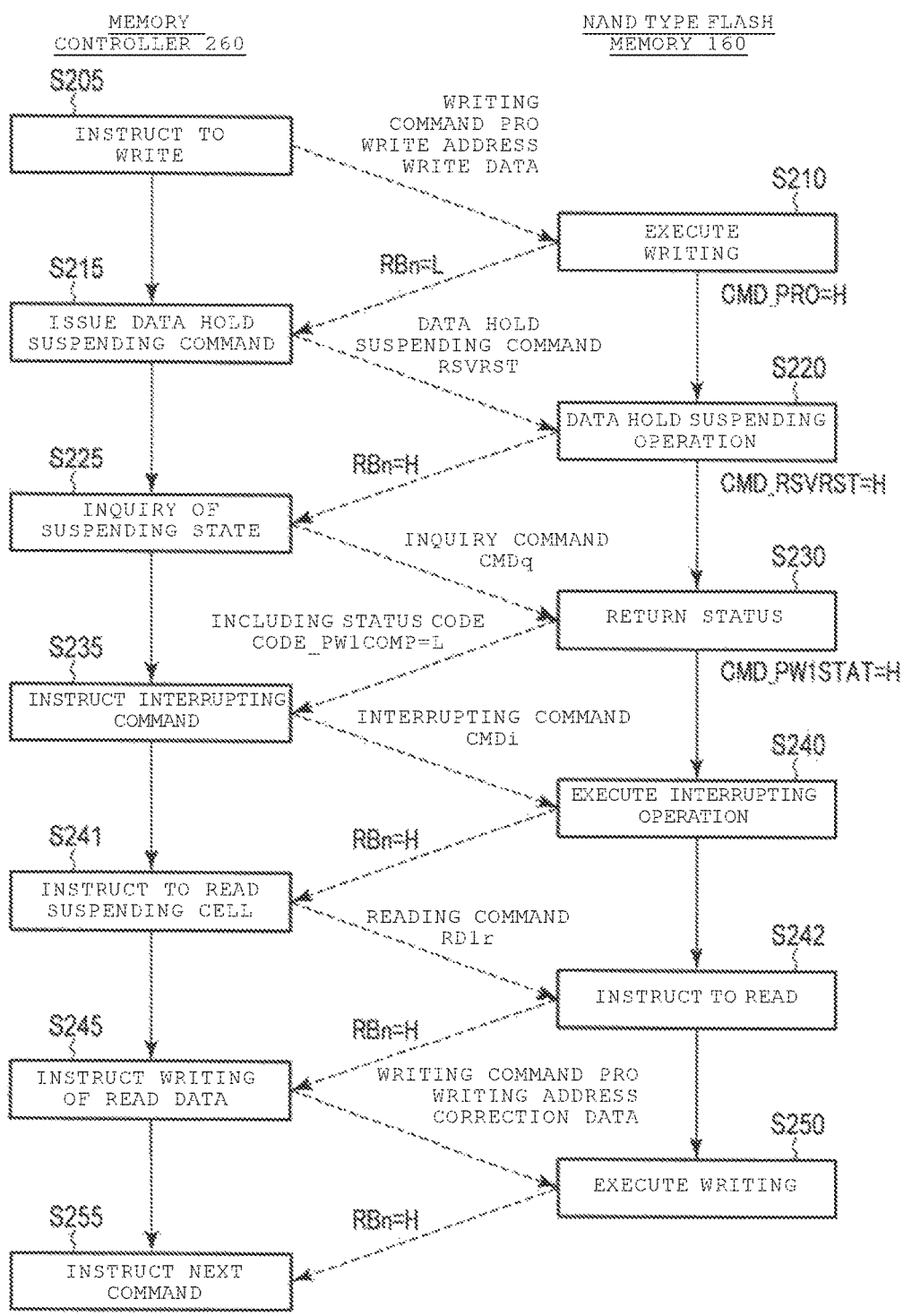
FIG. 23 is a diagram illustrating a flow of tasks between the memory controller and the semiconductor memory device during the second operation in the semiconductor memory device according to a modification example of the second embodiment.

The operations in steps S205 to S240 in FIG. 23 are the same as the operation in FIG. 20. In the subsequent step S241, a memory controller 260 transmits a reading command RD1r to the memory 160 when the writing operation is restarted. The reading command RD1r instructs the memory 160 to read the data from the transistor MT in which the writing operation is suspended. Unlike the reading command at a normal time, the reading command RD1r instructs the memory 160 to use a read voltage for determination of the "A1" level to "C1" level.

The state machine 120 performs reading of the data in accordance with the reading command RD1r based on the fact that the memory 160 receives the reading command RD1r (step S242). The read data is received by the memory controller 260. The memory controller 260 corrects errors in the read data with using the ECC circuit 206. The data which is read from the memory 160 and subjected to the error correction corresponds to the write data in step S205.

The memory controller 260 transmits the writing command PRO, the address of the writing destination, and the write data to the memory 160 (step S245). When the memory 160 receives the writing command PRO, the state machine 120 restarts the writing operation (step S250).

In this way, according to Modification Example, after performing the indicated suspension of the writing operation in the first operation, the memory 160 receives the reading command RD1r, and reads the data from the transistor MT in which the writing operation is suspended, before the writing operation is restarted. For this reason, in order to restart the writing operation which is suspended in the first operation in accordance with the instruction, the memory controller 260 may reproduce the write data with using the data which is temporarily held in the transistor MT without holding the write data in the caches LDL, UDL, and XDL. In such a case, the write data is not necessarily held by the memory controller 260. Therefore, it is possible to erase the write data in the buffer memory 240 after, for example, step S205 in FIG. 23, so as to use for other purposes.

Other Embodiments

An order of steps in an operation flow may be interchangeable, as long as it is possible. For example, the notification of the status code CODE_PW1COMP, the execution of the suspending operation, and the execution of the interrupting operation are interchangeable. For example, the status code CODE_PW1COMP may be notified after suspending the writing operation, and the status code CODE_PW1COMP may be transmitted after executing the interrupting operation.

In addition, in the embodiments and Modification Examples, when restarting the writing without accompanying the output of the write data, an example of using the writing commands PROr and PRSr which are different from the typical writing commands PRO and PRS has been described, but the invention is not limited thereto. In a case of receiving the writing command when, for example, the status code CODE_PW1COMP is at the "L" level without performing distinction in accordance with the writing command, the NAND type flash memory may have a function of starting the writing without outputting data.

The data which is written in the memory cell transistor may be 3-bit or greater. For example, in a case of 3-bit data, storage spaces of a pair of memory cell transistors MT in which data items are collectively written include a lower page, a middle page, and an upper page.

A NAND string NS may be a flat NAND string having a Metal-Oxide-Nitride-Oxide-Silicon (MONOS) structure.

In the above-described embodiments and Modification Examples, a storing method of the memory cell may be a binary storing method and a multivalued storing method. The reading operation, the writing operation, and the erasing operation in the memory cell using the multivalued storing method will be described below in detail.

For example, in the reading operation at a multivalued level, the level is determined to be an A level, a B level, and a C level in an ascending order of the threshold voltage. In the above reading operation, during the reading operation at the A level, the voltage which is applied to the selected word line is, for example, in a range of 0 V to 0.55 V. However, the voltage value is not limited thereto, but may be in a range of 0.1 V to 0.24 V, 0.21 V to 0.31 V, 0.31 V to 0.4 V, 0.4 V to 0.5 V, or 0.5 V to 0.55 V. During the reading operation at the B level, the voltage which is applied to the selected word line is, for example, in a range of 1.5 V to 2.3 V. However, the voltage value is not limited thereto, but may be in a range of 1.65 V to 1.8 V, 1.8 V to 1.95 V, 1.95 V to 2.1 V, or 2.1 V to 2.3 V. During the reading operation at the C level, the voltage which is applied to the selected word line is, for example, in a range of 3.0 V to 4.0 V. However, the voltage value is not limited thereto, but may be in a range of 3.0 V to 3.2 V, 3.2 V to 3.4 V, 3.4 V to 3.5 V, 3.5 V to 3.6 V, or 3.6 V to 4.0 V. A reading operation time (tR) may be in a range of, for example, 25 µs to 38 µs, 38 µs to 70 µs, or 70 µs to 80 µs.

The writing operation includes a program operation and verifying operation. In the writing operation, the voltage which is firstly applied to the word line selected during program operation is in a range of, for example, 13.7 V to 14.3 V. However, the voltage value is not limited thereto, and may be in a range of 13.7 V to 14.0 V, or 14.0 V to 14.6 V. The voltage, which is firstly applied to the word line selected during the writing operation for the odd-number word line, and the voltage, which is firstly applied to the word line selected during the writing operation for the even-number word line may have different values. When the program operation is assumed to be an incremental step pulse program (ISPP), about a voltage of 0.5 V may be applied as a step up voltage. The voltage which is applied to the unselected word line is in a range of, for example, 6.0 V to 7.3 V. However, the voltage value is not limited thereto, but may be in a range of 7.3 V to 8.4 V, or may be 6.0 V or lower. A pass voltage which is applied to the word line may be differentiated depending on whether the unselected word line is the odd-number word line or the even-number word line. A writing operation time (tProg) may be in a range of, for example, 1,700 µs to 1,800 µs, 1,800 µs to 1,900 µs, or 1,900 µs to 2,000 µs.

In the erasing operation, the voltage which is firstly applied to a well which is arranged on the upper portion of the semiconductor substrate, and on which the memory cells are arranged on the upper side thereof, is in a range of, for example, 12 V to 13.6 V. However, the voltage value is not limited thereto, but may be in a range of 13.6 V to 14.8 V, 14.8 V to 19.0 V, 19.0 V to 19.8 V, or 19.8 V to 21 V. An erasing operation time (tErase) may be in a range of, for example, 3,000 µs to 4,000 µs, 4,000 µs to 5,000 µs, and 4,000 µs to 9,000 µs.

In addition, the memory cell may have, for example, the following structure. The memory cell includes a charge accumulation film which is arranged on the semiconductor substrate such as a silicon substrate via a tunnel insulating film having a film thickness of 4 nm to 10 nm. The charge accumulation film may be a stacked structure of an insulating film such as a silicon nitride (SiN) film having a film thickness of 2 nm to 3 nm, a silicon oxynitride (SiON) film, and a polysilicon (Poly-Si) film having the film thickness of 3 nm to 8 nm. The polysilicon film may contain metal, for example, ruthenium (Ru). The memory cell includes the insulating film on the charge accumulation film. This insulating film includes, for example, a silicon oxide (SiO) film having a film thickness of 4 nm to 10 nm, which is interposed between a lower layer High-k film having a film thickness of 3 nm to 10 nm, and an upper layer High-k film having a film thickness of 3 nm to 10 nm. Examples of materials of the High-k film include hafnium oxide (HfO) and the like. In addition, the film thickness of the silicon oxide film may be greater than the film thickness of the High-k film. A control electrode having a film thickness of 30 nm to 70 nm is provided on the insulating film via a film having a film thickness of 3 nm to 10 nm. Here, examples of such a film include a metal oxide film formed of tantalum oxide (TaO), a metal nitride film formed of tantalum nitride (TaN), and the like. As the control electrode, tungsten (W) or the like may be used. It is possible to arrange an air gap between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory cell; and
   a control circuit configured to execute a writing operation on the memory cell in response to a write command, the writing operation including a first operation in which a first initial program voltage is applied and a second operation in which a second initial program voltage higher than the first initial program voltage is applied,
   wherein the control circuit, in response to a status inquiry command, outputs a first signal when the status inquiry command is received during execution of the first operation, and outputs a second signal which is different from the first signal when the status inquiry command is received during execution of the second operation.

2. The device according to claim 1, wherein
   data which are written into the memory cell include first data and second data which are separately received and stored in different latches, and
   the first data and the second data are stored in the latches until the first operation is completed.

3. The device according to claim 2, wherein
   the first data and the second data become invalid in the latches during the second operation.

4. The device according to claim 3, wherein the control circuit, in response to a suspend command, suspends the writing operation, and thereafter, in response to a restart write command, executes the first and second operations without storing the first data and the second data in the latches if the first signal was output in response to the status inquiry command, and only the second operation after storing the first data and the second data in the latches if the second signal was output in response to the status inquiry command.

5. The device according to claim 1, wherein upon completion of the first operation, the control circuit stores a first value into a status register indicating that the first operation has completed and upon completion of the second operation, stores a second value which is different from the first value in the status register.

6. The device according to claim 5, wherein the first signal is output in response to the status inquiry command if the status register stores the first value and the second signal is output in response to the status inquiry command if the status register stores the second value.

7. A semiconductor memory device comprising:
   a memory cell; and
   a control circuit configured to execute a writing operation on the memory cell in response to a write command, the writing operation including a first operation in which a first initial program voltage is applied and a second operation in which a second initial program voltage higher than the first initial program voltage is applied,
   wherein the control circuit, in response to a first command, suspends the writing operation, and thereafter, in response to a second command outputs a first signal when the first command is received during execution of the first operation, and outputs a second signal which is different from the first signal when the first command is received during execution of the first operation.

8. The device according to claim 7, wherein
the control circuit, in response to a first command, suspends the writing operation after completion of the first operation if the first command is received during the first operation.

9. The device according to claim 8, wherein
data which are written into the memory cell include first data and second data which are separately received and stored in different latches, and
the first data and the second data are stored in the latches until the first operation is completed.

10. The device according to claim 9, wherein
the first data and the second data become invalid in the latches during the second operation.

11. The device according to claim 10, wherein the control circuit, in response to a restart write command, executes only the second operation after storing the first data and the second data in the latches.

12. The device according to claim 10, wherein the control circuit executes an interrupting operation in response to a third command, and then performs a read of the first data written into the memory cell prior to restarting the suspended writing operation.

13. The device according to claim 7, wherein upon completion of the first operation, the control circuit stores a first value into a status register indicating that the first operation has completed and upon start of the first operation, stores a second value which is different from the first value in the status register.

14. The device according to claim 13, wherein the first signal is output in response to the second command if the status register stores the first value and the second signal is output in response to the second command if the status register stores the second value.

15. A memory system comprising:
a semiconductor memory device that includes a memory cell, and a control circuit configured to control operations on the memory cell; and
a memory controller configured to issue commands to the semiconductor memory device in response to instructions received from a host device,
wherein the memory controller transmits a first command which instructs the memory cell to perform a writing operation including a first operation and a second operation to the semiconductor memory device, and transmits a second command to the semiconductor memory device based on an instruction from the host device, and
wherein the control circuit performs the first operation using a first initial voltage, and the second operation using a second initial voltage which is higher than the first initial voltage, and in response to the second command, transmits a first signal to the memory controller when the second command is received during execution of the first operation, and transmits a second signal which is different from the first signal to the memory controller when the second command is received during execution of the second operation.

16. The system according to claim 15, wherein
the memory controller issues an interrupting command to the control circuit after receiving the first or second signal from the control circuit.

17. The system according to claim 16, wherein the memory controller transmits a restart write command when a ready signal is received from the control circuit after the memory controller issued the interrupting command to the control circuit.

18. The system according to claim 17, wherein the restart write command is one of a first type that does not cause reloading of write data into latches that the control circuit uses during the writing operation, and a second type that causes reloading of the write data into the latches.

19. The system according to claim 18, wherein the restart write command is the first type if the first signal was received from the control circuit in response to the second command.

20. The system according to claim 18, wherein the restart write command is the second type if the second signal was received from the control circuit in response to the second command.

* * * * *